(12) United States Patent
Rosenblatt et al.

(10) Patent No.: US 10,475,983 B1
(45) Date of Patent: Nov. 12, 2019

(54) ANTENNA-BASED QUBIT ANNEALING METHOD

(71) Applicant: International Business Machines Corporation, Armonk, NY (US)

(72) Inventors: Sami Rosenblatt, White Plains, NY (US); Rasit Onur Topaloglu, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/114,971

(22) Filed: Aug. 28, 2018

(51) Int. Cl.
  *H01L 27/18* (2006.01)
  *H01L 39/00* (2006.01)
  (Continued)

(52) U.S. Cl.
  CPC .......... *H01L 39/249* (2013.01); *G06N 10/00* (2019.01); *H01L 39/025* (2013.01); *H01L 39/223* (2013.01); *H01L 39/2493* (2013.01)

(58) Field of Classification Search
  CPC . H01L 39/249; H01L 39/025; H01L 39/2493; H01L 39/223; H01L 27/18; G06N 10/00; G06N 99/002
  See application file for complete search history.

(56) References Cited

U.S. PATENT DOCUMENTS 5,532,592 A * 7/1996 Colclough ......... G01R 33/0356
                                                324/248
6,960,780 B2  11/2005 Blais et al.
(Continued)

FOREIGN PATENT DOCUMENTS

WO    2017047380 A1   3/2017
WO    2017078735 A1   5/2017
(Continued)

OTHER PUBLICATIONS

List of IBM Patents or Applications Treated as Related.
(Continued)

*Primary Examiner* — Savitri Mulpuri
(74) *Attorney, Agent, or Firm* — Amin, Turocy & Watson, LLP

(57) ABSTRACT

Systems and techniques facilitating antenna-based thermal annealing of qubits are provided. In one example, a radio frequency emitter, transmitter, and/or antenna can be positioned above a superconducting qubit chip having a Josephson junction coupled to a set of one or more capacitor pads. The radio frequency emitter, transmitter, and/or antenna can emit an electromagnetic signal onto the set of one or more capacitor pads. The capacitor pads can function as receiving antennas and therefore receive the electromagnetic signal. Upon receipt of the electromagnetic signal, an alternating current and/or voltage can be induced in the capacitor pads, which current and/or voltage thereby heat the pads and the Josephson junction. The heating of the Josephson junction can change its physical properties, thereby annealing the Josephson junction. In another example, the emitter can direct the electromagnetic signal to avoid unwanted annealing of neighboring qubits on the superconducting qubit chip.

6 Claims, 18 Drawing Sheets

(51) Int. Cl.
  *H01L 39/24* (2006.01)
  *H01L 39/02* (2006.01)
  *H01L 39/22* (2006.01)
  *G06N 10/00* (2019.01)

(56) References Cited

U.S. PATENT DOCUMENTS

| | | | |
|---|---|---|---|
| 7,893,708 | B2 | 2/2011 | Baumgardner et al. |
| 8,193,808 | B2 | 5/2012 | Fu et al. |
| 8,633,472 | B2 | 1/2014 | Boulaevskii et al. |
| 8,922,239 | B2 | 12/2014 | Pesetski et al. |
| 9,564,573 | B1 * | 2/2017 | Chang .................. H01L 39/025 |
| 9,607,270 | B2 | 3/2017 | Harris et al. |
| 9,614,532 | B1 * | 4/2017 | Bulzacchelli ........ H03K 19/195 |
| 9,685,935 | B2 | 6/2017 | Strand et al. |
| 9,934,468 | B2 | 4/2018 | Mohseni et al. |
| 9,948,254 | B2 * | 4/2018 | Narla .................... H03F 19/00 |
| 10,050,630 | B2 * | 8/2018 | Reagor ............... H03K 19/195 |
| 10,074,793 | B2 * | 9/2018 | Abdo ...................... H01L 27/18 |
| 10,134,972 | B2 * | 11/2018 | Oliver ................ H01L 25/0657 |
| 10,170,680 | B2 * | 1/2019 | Abraham .............. G06N 10/00 |
| 10,170,681 | B1 * | 1/2019 | Rosenblatt ........... G06N 10/00 |
| 10,187,065 | B2 * | 1/2019 | Kerman ................ G06N 10/00 |
| 10,256,392 | B1 * | 4/2019 | Brink .................. H01L 39/2493 |
| 10,268,968 | B2 * | 4/2019 | Abraham .............. G06N 10/00 |
| 10,320,331 | B1 * | 6/2019 | Abdo .................... G06N 10/00 |
| 2012/0075158 | A1 | 3/2012 | Kawahata |
| 2017/0092834 | A1 | 3/2017 | Fong et al. |
| 2017/0155361 | A1 | 6/2017 | Suzuki et al. |
| 2017/0300827 | A1 | 10/2017 | Amin et al. |
| 2018/0054201 | A1 | 2/2018 | Reagor et al. |
| 2018/0013426 | A1 | 6/2018 | Deurloo et al. |

FOREIGN PATENT DOCUMENTS

| | | | |
|---|---|---|---|
| WO | 2017105429 | A1 | 6/2017 |
| WO | 2017139683 | A1 | 8/2017 |
| WO | 2018063206 | A1 | 4/2018 |

OTHER PUBLICATIONS

Bredendiek, Christian, et al. "Differential Signal Source Chips at 150 GHz and 220 GHz in SiGe Bipolar Technologies Based on Gilbert-Cell Frequency Doublers." Bipolar/BiCMOS Circuits and Technology Meeting (BCTM), 2012 IEEE. 4 pages.

Liu, W.Y., et al. "Superconducting quantum bits." Chinese Physics B, 27(2), p. 027401. 12 pages.

Brecht, Teresa, et al."Multilayer microwave integrated quantum circuits for scalable quantum computing." npj Quantum Information, 2, p. 16002. Feb. 23, 2016. 4 pages.

Tan, Yanghong, et al. "Automatic impedance matching and antenna tuning using quantum genetic algorithms for wireless and mobile communications." IET Microwaves, Antennas & Propagation, 7(8), pp. 693-700. 2013. 8 pages.

Digital Adjustment of DC-DC Converter Output Voltage in Portable Applications. Maxim Integrated. Last Accessed Jul. 30, 2018. 13 pages. https://www.maximintegrated.com/en/app-notes/index.mvp/id/818.

Patra Bishnu, et al. "Cryo-CMOS Circuits and Systems for Quantum Computing Applications." IEEE Journal of Solid-State Circuits. 2018. 13 pages.

* cited by examiner

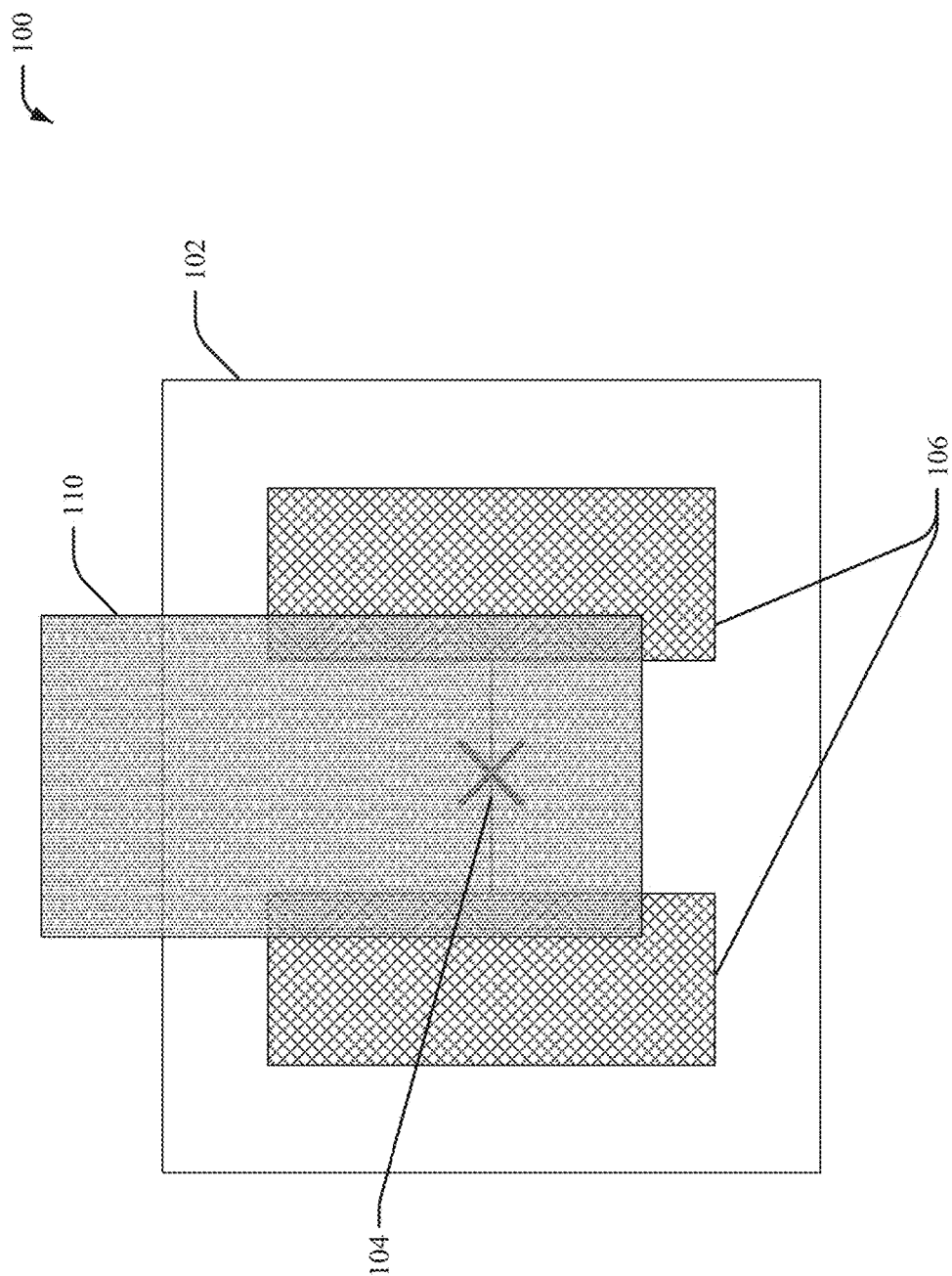

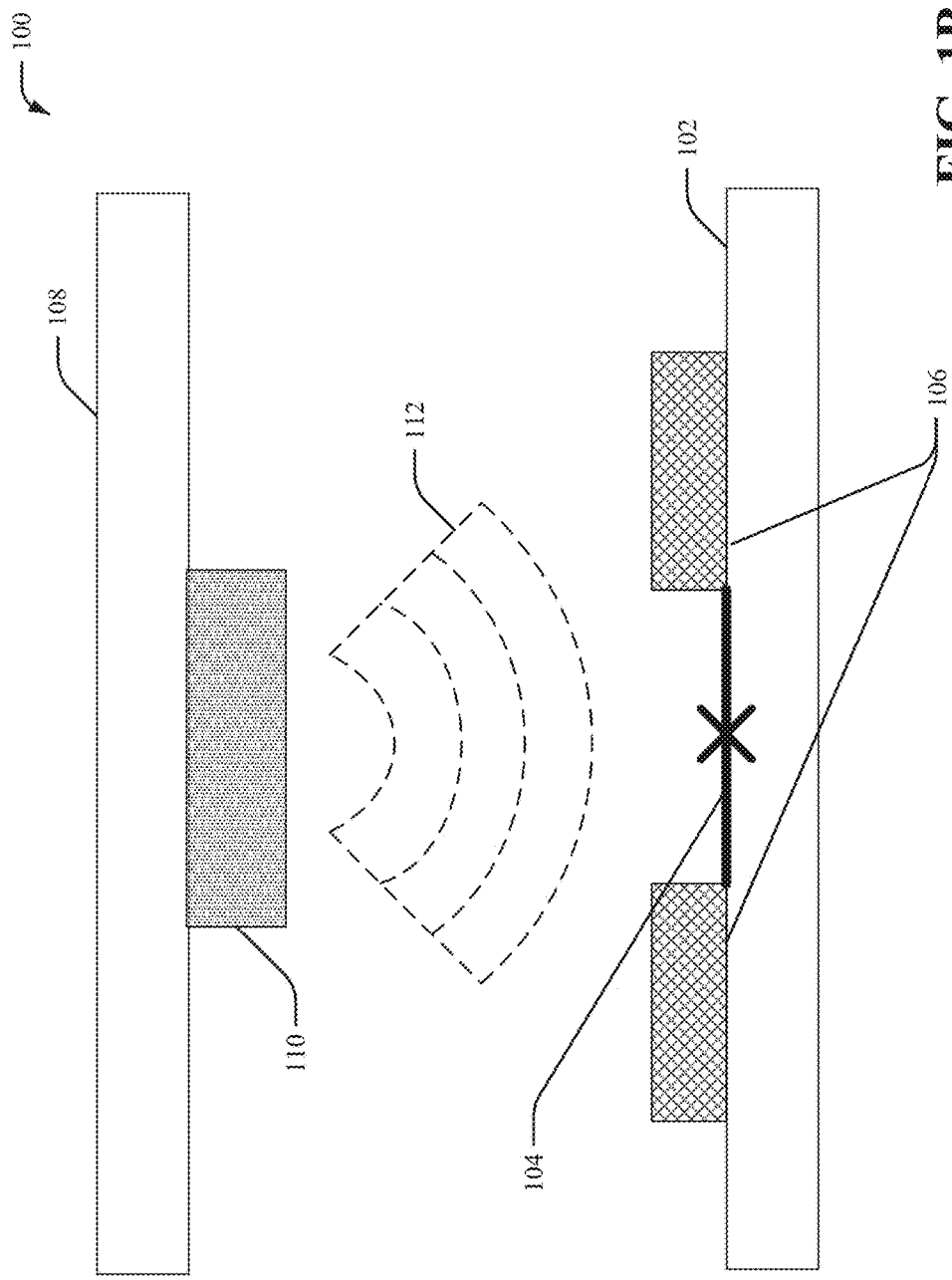

ANTENNA-BASED QUBIT ANNEALING METHOD

BACKGROUND

The subject disclosure relates to qubit annealing, and more specifically, to facilitating qubit annealing with antennas. The qubit (e.g., quantum binary digit) is the quantum-mechanical analogue of the classical bit. Whereas classical bits can take on only one of two basis states (e.g., 0 or 1), qubits can take on superpositions of those basis states (e.g., $\alpha|0\rangle + \beta|1\rangle$, where $\alpha$ and $\beta$ are complex scalars such that $|\alpha|^2 + |\beta|^2 = 1$), allowing a number of qubits to theoretically hold exponentially more information than the same number of classical bits. Thus, quantum computers (e.g., computers that employ qubits instead of solely classical bits) can, in theory, quickly solve problems that would be extremely difficult for classical computers. The efficacy of quantum computers can be improved by improving the fabrication and processing of multi-qubit chips. Due to the phenomenon of frequency collision and/or quantum cross-talk (e.g., multiple neighboring qubits having too similar resonant frequencies such that they have undesired interactions with each other), the ability to precisely tune and/or alter qubit frequencies is paramount in the construction of multi-qubit chips. Traditional solutions for such frequency control include tuning of variable-frequency qubits and thermal annealing of fixed-frequency qubits. Variable-frequency qubits have resonant frequencies that can be tuned by exposure to external magnetic fields; however, the additional tuning circuitry required on the qubit chip adds unnecessary complexity and noise. Thermal annealing of fixed-frequency qubits, which involves heating a qubit so as to change its physical properties (e.g., resonant frequency), does not introduce such noise during qubit operation (which is realized at cryogenic temperatures compatible with the superconducting regime). Traditionally, thermal annealing of qubits has been performed by using a photonic chip with a laser source physically routed to different locations on the photonic chip via Mach-Zehnder switches (realized at room temperature or at temperatures outside the superconducting regime). Although parallel annealing of multiple qubits on a multi-qubit chip is possible with such a system, the maximum laser power (e.g., and thus the maximum annealing capability) at each location on the photonic chip depends on the amount of power routed to the other locations on the chip (e.g., if more power from the laser source is routed to location 1, less power from the laser source is available to be simultaneously routed to location 2). Thus, traditional laser annealing of qubits is best suited to serial annealing rather than concurrent/parallel annealing of qubits. Therefore, traditional qubit annealing cannot facilitate independent and/or concurrent localized annealing of one or more qubits on a multi-qubit chip.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatus and/or computer program products that facilitate antenna-based qubit annealing are described.

According to one or more embodiments, a system can comprise a superconducting qubit chip having a first Josephson junction with a first set of one or more capacitor pads. The system can also comprise a first radio frequency (RF) emitter positioned above the superconducting qubit chip. The first RF emitter can emit a first electromagnetic signal onto the first set of one or more capacitor pads. Based on receipt of the first electromagnetic signal, the first set of one or more capacitor pads can generate an alternating current or voltage at or within a defined distance from the first Josephson junction. The generated alternating current or voltage can then anneal the first Josephson junction. An advantage provided by these one or more embodiments is the facilitation of a new technique of thermally annealing one or more qubits (e.g., via antenna-based electromagnetic waves, instead of photonic lasers) that leverages the existing quantum circuitry on the superconducting qubit chip (e.g., anneals qubits without having to modify the existing structure/circuitry of the qubit or qubit chip). Optionally, in one or more embodiments, the system can comprise a second Josephson junction on the superconducting qubit chip with a second set of one or more capacitor pads. In such case, the first RF emitter can localize the first electromagnetic signal toward the first set of one or more capacitor pads of the first Josephson junction to prevent annealing of the second Josephson junction by the first electromagnetic signal. An advantage provided by these one or more embodiments is the facilitation of independent qubit annealing (e.g., annealing one qubit on a multi-qubit chip without unwantedly affecting properties of neighboring qubits, such that each of the qubits can achieve various and/or distinct and/or different levels of annealing). In one or more other embodiments, the system can optionally further comprise a second RF emitter. The second RF emitter can emit and localize a second electromagnetic signal toward the second set of one or more capacitor pads, thereby annealing the second Josephson junction. Moreover, the second RF emitter can emit and localize the second electromagnetic signal independently of and concurrently or sequentially with the first RF emitter emitting and localizing the first electromagnetic signal, thereby respectively facilitating independent and concurrent or sequential localized annealing of the first Josephson junction and the second Josephson junction. An advantage of these one or more embodiments is to facilitate independent and/or concurrent/parallel localized annealing of multiple qubits on a multi-qubit chip (e.g., annealing more than one qubit on the same chip simultaneously and independently, such that each qubit can achieve a distinct level of annealing that can be different from the levels of annealing of neighboring qubits), thereby expediting the overall annealing process to save time as compared to serial annealing, as well as improving frequency allocation and reducing quantum cross-talk.

According to one or more embodiments, a computer-implemented method can comprise emitting, via a first RF emitter, a first electromagnetic signal onto a first set of one or more capacitor pads of a first Josephson junction of a superconducting qubit chip. The emitting can induce an alternating current or voltage in the first set of one or more capacitor pads. The alternating current or voltage can then heat the first Josephson junction, thereby annealing the first Josephson junction based on the emitting. An advantage of these one or more embodiments is to facilitate a new technique of thermally annealing qubits that leverages existing quantum circuitry on the superconducting qubit chip (e.g., elimination of need to alter existing quantum circuitry on the superconducting qubit chip). Optionally, in one or more embodiments, the computer-implemented method can further comprise localizing, by the first RF emitter, the first electromagnetic signal toward the first set of one or more capacitor pads of the first Josephson junction. This can prevent annealing of a second Josephson junction on the superconducting qubit chip by the first electromagnetic signal. An advantage of these one or more embodiments is to facilitate independent annealing of multiple qubits (e.g., annealing one qubit on a multi-qubit chip to a defined level of annealing without unwantedly affecting/annealing other nearby qubits on the multi-qubit chip). In one or more other embodiments, the computer-implemented method can optionally further comprise annealing, by a second RF emitter, the second Josephson junction by emitting and localizing a second electromagnetic signal toward a second set of one or more capacitor pads of the second Josephson junction. Moreover, the emitting and localizing of the second electromagnetic signal can occur independently of and concurrently or sequentially with the emitting and localizing of the first electromagnetic signal. This can respectively facilitate independent and concurrent or sequential localized annealing of the first Josephson junction and the second Josephson junction. An advantage of these one or more embodiments is to facilitate independent and concurrent localized annealing of multiple qubits on a multi-qubit chip (e.g., simultaneously annealing more than one qubit on a multi-qubit chip, such that each qubit on the chip achieves a distinct level of annealing, and such that the distinct levels of annealing of the various qubits on the chip can be different).

According to one or more embodiments, an apparatus can comprise a superconducting qubit chip having a first qubit with a first set of one or more capacitor pads and a first Josephson junction. The apparatus can also comprise a first antenna, located above the superconducting qubit chip. The first antenna can emit a first electromagnetic wave onto the first set of one or more capacitor pads. The first electromagnetic wave can then heat the first qubit, thereby annealing the first Josephson junction of the first qubit. An advantage of these one or more embodiments is to facilitate a new technique of qubit annealing that makes use of existing quantum circuitry on a superconducting qubit chip, thereby eliminating the need to retrofit the chip with specialized annealing/tuning circuitry. Optionally, in one or more embodiments, the first antenna can adjust at least one of a duration, a frequency, or a magnitude of the first electromagnetic wave to achieve a defined level of the annealing of the first Josephson junction of the first qubit. An advantage of these one or more embodiments is to facilitate independent annealing of a qubit, such that the level of annealing achieved by the qubit can be controlled by controlling/adjusting characteristics of the emitted electromagnetic waves.

According to one or more embodiments, a computer-implemented method can comprise emitting, via a first antenna, a first electromagnetic wave onto a first set of one or more capacitor pads of a superconducting qubit chip. The first electromagnetic wave can then heat a first Josephson junction of a first qubit of the superconducting qubit chip, thereby annealing the first Josephson junction of the first qubit based on the emitting. An advantage of these one or more embodiments is to facilitate a new technique of qubit annealing that makes use of existing quantum circuitry on a superconducting qubit chip, thereby eliminating the need to retrofit the chip with specialized annealing/tuning circuitry. Optionally, in one or more embodiments, the computer-implemented method can further comprise adjusting at least one of a duration, a frequency, or a magnitude of the first electromagnetic wave to achieve a defined level of the annealing of the first Josephson junction of the first qubit. An advantage of these one or more embodiments is to facilitate independent annealing of a qubit, such that the level of annealing achieved by the qubit can be controlled by controlling/adjusting characteristics of the emitted electromagnetic waves.

According to one or more embodiments, a device can comprise a superconducting qubit chip having one or more qubits. The device can also comprise a semiconductor chip having one or more electromagnetic transmitters. The semiconductor chip can be mounted on the superconducting qubit chip so that at least one of the one or more qubits has above it a corresponding one of the one or more electromagnetic transmitters. The corresponding one of the one or more electromagnetic transmitters can then emit a localized electromagnetic wave toward a set of one or more capacitor pads of the at least one of the one or more qubits. The localized electromagnetic wave can then heat the at least one of the one or more qubits, thereby annealing a Josephson junction of the at least one of the one or more qubits. An advantage of these one or more embodiments is to facilitate independent and concurrent annealing of multiple qubits on a multi-qubit chip.

DESCRIPTION OF THE DRAWINGS

FIGS. 1A and 1B respectively illustrate a top-view schematic and a side-view schematic of an example, non-limiting system that facilitates antenna-based qubit annealing in accordance with one or more embodiments described herein.

DETAILED DESCRIPTION

Figure 2:
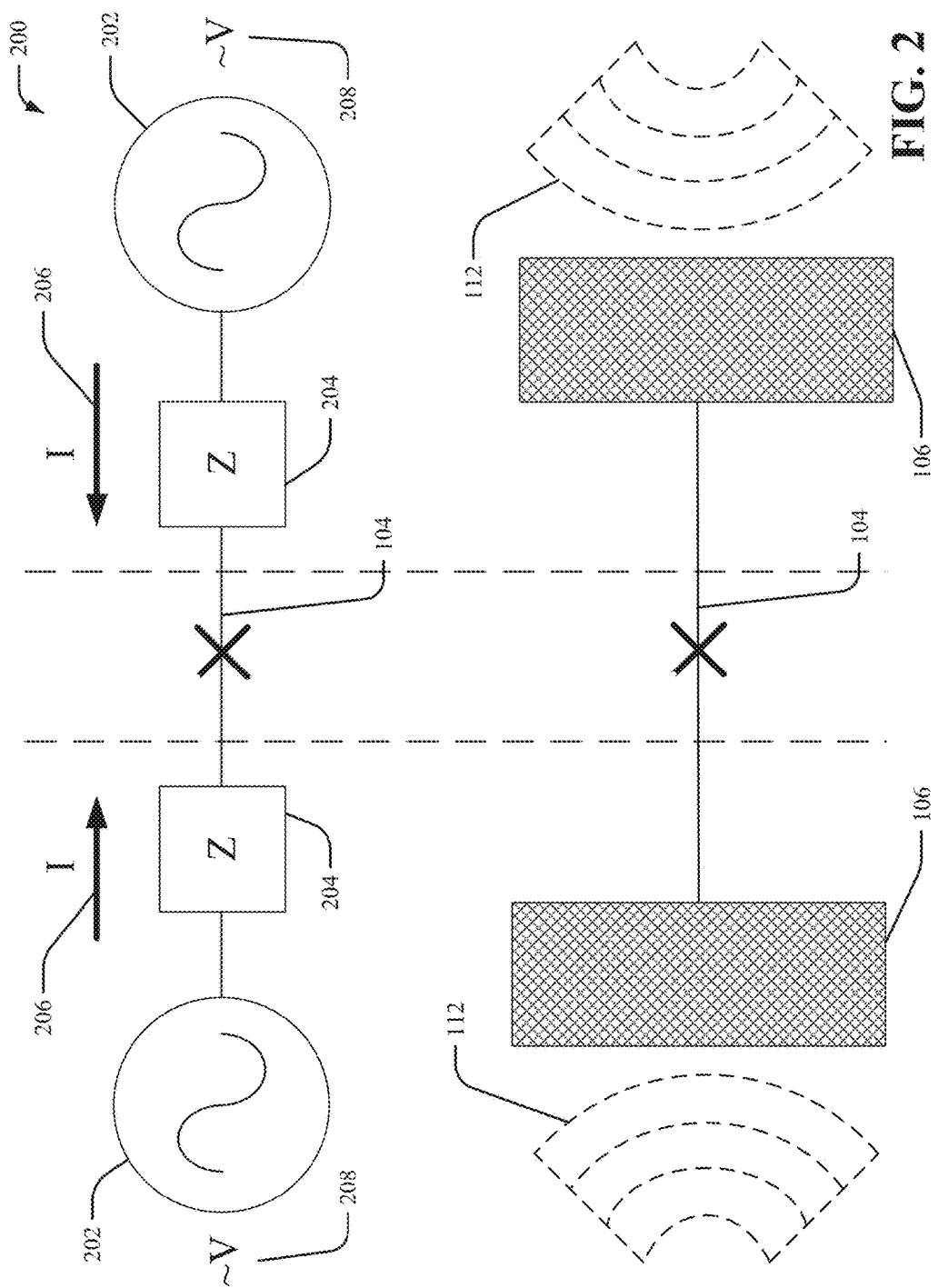
FIG. 2 illustrates an equivalent circuit diagram of an example, non-limiting system that facilitates antenna-based qubit annealing in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Superconducting qubits offer a promising path toward constructing fully-operational quantum computers. This is because they can exhibit quantum-mechanical behavior (allowing them to be used for quantum information processing) at the macroscopic level (allowing them to be designed and fabricated by existing integrated circuit technologies). The fundamental building-block of superconducting qubits is the Josephson junction. Josephson junctions can be formed by sandwiching a non-superconducting material between two superconducting materials, and can be modified by thermal annealing (e.g., heat treating). The annealing of a qubit (e.g., annealing a qubit's Josephson junction) can change a transition frequency of the qubit (e.g., a resonant frequency marking the transition between a qubit's ground state and an excited state). Such manipulation of qubit transition frequencies can enable optimized frequency allocation, thereby minimizing frequency collisions and/or quantum cross-talk. For example, multiple qubits on a multi-qubit chip can be individually/independently annealed such that each qubit has a distinct transition frequency from those of its neighboring qubits, thereby decreasing the likelihood of neighboring qubits inappropriately responding to a computational and/or control signal meant to induce a response in only a certain qubit. Concurrent and localized annealing of qubits would thus benefit the operation of multi-qubit chips. However, a problem in the prior art is that there is no known scalable method/system for performing such concurrent and localized qubit annealing to modify qubit frequencies.

Various embodiments of the present invention can provide solutions to this problem in the art. One or more embodiments described herein include systems, computer-implemented methods, apparatus, and/or computer program products that facilitate concurrent and localized qubit annealing. More specifically, one or more embodiments pertaining to concurrent and/or localized qubit-annealing using antennas and/or electromagnetic emitters are described. For example, in one or more embodiments, a radio frequency emitter can emit an electromagnetic signal onto a set of one or more capacitor pads of a Josephson junction, wherein the Josephson junction is a component of a qubit on a superconducting qubit chip. In one or more non-limiting embodiments, the set of one or more capacitor pads of the Josephson junction can be a set of one or more transmon capacitor pads of the Josephson junction (e.g., pads of a capacitor, which capacitor is coupled in parallel with the Josephson junction). The set of one or more capacitor pads can receive the electromagnetic signal; that is, each pad can function as a receiving antenna. In one or more non-limiting embodiments, each pad can function as a patch antenna on the superconducting qubit chip. Based on receipt by the set of one or more capacitor pads, the electromagnetic signal can induce an alternating current and/or voltage in the set of one or more capacitor pads and/or at or within a defined distance from the Josephson junction (e.g., in the circuit lines electrically coupling the pads to the Josephson junction). That is, the electromagnetic signal can cause electrons in each of the set of one or more capacitor pads to oscillate, thereby creating an alternating current and/or voltage oscillating in the pads themselves, in the circuit lines electrically coupling the pads to the Josephson junction, and/or at/across the Josephson junction. The oscillation of electrons in the pads and/or the circuit lines coupling the pads to the junction and/or the junction itself can heat the Josephson junction. Such heating can affect the properties of the Josephson junction, thereby modifying a transition frequency of the qubit. Thus, localized qubit annealing can be performed without having to add and/or subtract circuitry to/from the superconducting qubit chip. In one or more other embodiments, multiple electromagnetic emitters can be implemented concurrently so as to perform localized annealing on multiple qubits simultaneously. Thus, various embodiments of the present invention can address problems in the art by facilitating independent and concurrent localized annealing of one or more qubits on a multi-qubit chip.

The embodiments described herein relate to systems, computer-implemented methods, apparatus, and/or computer program products that employ highly technical hardware and/or software to technologically solve technological problems in the field of qubit annealing (e.g., thermal annealing of qubits).

Specifically, the field of qubit annealing (which is entirely distinct and separate from the field of quantum annealing) suffers from a lack of scalable and efficient systems and/or computer-implemented methods for individually, independently, and/or concurrently annealing one or more superconducting qubits on a superconducting qubit chip. As described thoroughly below, one or more embodiments of the present invention can address this technical problem by providing a scalable and efficient system and/or computer-implemented method that utilizes one or more electromagnetic transmitters to excite sets of one or more capacitor pads of one or more superconducting qubits on a superconducting qubit chip. The electromagnetic transmitters can emit electromagnetic radiation (e.g. an electromagnetic wave and/or signal) onto the capacitor pads of a qubit, thereby heating (and therefore annealing) the qubit.

In one or more embodiments, one or more emitters/transmitters can correspond in a one-to-one fashion to one or more qubits on the superconducting qubit chip, wherein each emitter can be individually and/or independently voltage and/or frequency tunable. That is, each emitter can be controlled so as to manipulate a duration, a frequency, and/or a magnitude of the electromagnetic wave that it can generate. Each wave/signal can then induce a distinct amount of annealing of the qubit onto which it is emitted. So, each qubit can be individually and/or independently annealed (e.g., by adjusting the voltage and/or frequency of its corresponding emitter/antenna) such that it receives a unique and/or defined level of annealing as compared to its neighboring qubits on the superconducting qubit chip. In other words, each of the qubits can achieve a defined level of annealing via the systems and/or computer-implemented methods disclosed herein. For example, one or more embodiments can facilitate annealing a first qubit by a first electromagnetic signal for a first time period, and annealing a second qubit by a second electromagnetic signal for a second time period, wherein the two time periods can be of the same length and/or of different lengths, and/or wherein the two signals can be of the same frequencies, wavelengths, and/or magnitudes and/or of different frequencies, wavelengths, and/or magnitudes. Moreover, the one or more emitters can operate concurrently, thereby facilitating independent and/or concurrent localized annealing of the one or more qubits (e.g., annealing a first qubit for a first time period, and annealing a second qubit for a second time period, wherein the two time periods can be overlapping and/or non-overlapping). Such concurrent and localized annealing addresses problems in the prior art by saving time as compared to serial annealing and improving operation/functionality of multi-qubit chips by eliminating frequency collisions and/or quantum cross-talk.

Not only can the disclosed systems and/or computer-implemented methods efficiently and precisely anneal superconducting qubits individually and concurrently, but they can also do so without having to change, modify, and/or otherwise adapt the quantum circuitry of the qubits and/or the superconducting qubit chip. For example, there is no need to physically solder, build through manufacturing steps, couple, and/or etch extra capacitors, inductors, resistors, and/or any other circuitry to the qubit to be annealed. Instead, one or more embodiments disclosed herein can facilitate qubit annealing by leveraging the existing quantum circuitry on the superconducting qubit chip (e.g., emitting electromagnetic waves/signals onto existing capacitor pads that are already coupled to a Josephson junction). Thus, the prior art problem of having to incorporate additional tuning circuitry to tune qubit frequencies can be eliminated.

The above-mentioned technical improvements, which are more thoroughly described below, are not abstract, are not merely laws of nature or natural phenomena, and cannot be performed by humans without the use of specialized, specific, and concrete hardware and/or software (e.g., electromagnetic emitters, emitting electromagnetic signals onto capacitor pads, and so on).

Now, consider the drawings. FIGS. 1A and 1B respectively illustrate a top-view schematic and a side-view schematic of an example, non-limiting system that facilitates antenna-based qubit annealing in accordance with one or more embodiments described herein. With reference now to FIGS. 1A and 1B, there is illustrated an example system 100 that can facilitate antenna-based qubit annealing of qubits on a superconducting qubit chip 102. In various embodiments, the system 100 can be used to facilitate antenna-based annealing of qubits/Josephson junctions on the superconducting qubit chip 102 regardless of the fabrication stage of the qubits/Josephson junctions. That is, in one or more embodiments, the system 100 can be an antenna-based qubit annealing system that anneals qubits/Josephson junctions on the superconducting qubit chip 102, wherein the system 100 can be used for post-fabrication, pre-fabrication, and/or mid-fabrication processing/annealing of the qubits/Josephson junctions. For example, the superconducting qubit chip 102 can be fully etched/outfitted with qubits, quantum readout resonators, and/or other quantum circuitry such that the superconducting qubit chip 102 is fully-fabricated and ready to be implemented in a quantum computer once a defined level of annealing is accomplished. In other embodiments, the qubits/Josephson junctions on the superconducting qubit chip 102 can undergo additional fabrication/processing after being annealed by the system 100. In still other embodiments, the system 100 can be incorporated into a dedicated qubit-production and/or Josephson-junction-production process, wherein the superconducting qubit chip 102 is a dedicated platform/substrate on which one or more qubits/Josephson junctions are constructed, wherein the qubits/Josephson junctions are removed from the superconducting qubit chip 102 after annealing to be incorporated into other quantum computing chips.

In one or more embodiments, the superconducting qubit chip 102 can be a printed circuit board comprising one or more sheets/layers of conducting material (e.g., such as copper) laminated onto and/or between one or more sheets/layers of one or more non-conducting substrates. In various embodiments, any suitable conductors and/or non-conducting substrates known in the art can be used. In other embodiments, the superconducting qubit chip 102 can be any platform known in the art that is suitable to carry one or more superconducting qubits. Regardless of its construction, the superconducting qubit chip 102 can have on it one or more superconducting qubits, with a superconducting qubit comprising at least one Josephson junction.

As shown in FIG. 1A, the superconducting qubit chip 102 can have on it a superconducting qubit, wherein the superconducting qubit can comprise a Josephson junction 104 (marked with "X" in the drawings) and a set of one or more capacitor pads 106. The set of one or more capacitor pads 106 can comprise any capacitor pad construction known in the art. The Josephson junction 104 can be created by coupling two superconductors together via a weak link. As mentioned above, this can be accomplished by sandwiching a thin layer of non-superconducting material between two layers of superconducting material, wherein the layer of non-superconducting material is the weak link (e.g., S-N-S Josephson junction). This can also be accomplished by separating the superconductors with a thin insulating barrier, wherein the insulating barrier is the weak link (e.g., S-I-S Josephson junction). Additionally, this can be accomplished by applying a physical constriction at the point of contact between the two superconductors, wherein the constricted point is the weak link (e.g., S-s-S Josephson junction). Moreover, since the Josephson junction 104 is a macroscopic structure, it can be constructed by known integrated circuit technologies and/or techniques (e.g., photolithography, deposition, sputtering, evaporation, doping, and so on).

The Josephson junction 104 can exhibit a Cooper-pair quantum tunneling effect (e.g., electrons tunneling through the weak link in the absence of an applied voltage), thereby allowing for the flow of a supercurrent (e.g., electrical current flowing without resistance/dissipation) across the junction at sufficiently low temperatures. This quantum-mechanical behavior at the macroscopic level can allow the Josephson junction 104 to function as (or as part of) a qubit (e.g., a device that can occupy discrete/quantized energy states as well as superpositions of those energy states). In one or more embodiments, the Josephson junction 104 can be a component of a transmon qubit (e.g., a type of charge qubit), the quantized energy states of which can correspond to integer numbers of Cooper-paired electrons that have crossed the Josephson junction 104 and/or are present on a superconducting island formed in part by the Josephson junction 104. In other embodiments, the Josephson junction 104 can be a component of other types of qubits, such as a flux qubit (e.g., the quantized energy states of which can correspond to integer numbers of magnetic flux quanta penetrating a superconducting loop formed in part by the Josephson junction 104), a phase qubit (e.g., the quantized energy states of which can correspond to quantum charge oscillation amplitudes across the Josephson junction 104), and so on. In any case, properties of the Josephson junction 104 can affect the transition frequencies between these quantized energy states, and so annealing (e.g., heat treating) of the Josephson junction 104 can be implemented to tune, modify, and/or alter transition frequencies of a qubit comprising the Josephson junction 104. As mentioned above, such tuning, modification, and/or alteration can be implemented to reduce frequency collision and/or quantum crosstalk between multiple qubits, thereby improving the functionality and/or operation of multi-qubit chips.

Now, the drawings depict a transmon qubit design; that is, a superconducting qubit in which the Josephson junction 104 is coupled in parallel to a capacitor, which has a set of one or more capacitor pads 106 (also called "transmon capacitor pads 106," "capacitor pads 106," and/or "pads 106"). However, those of skill in the art will appreciate that one or more embodiments of the invention can incorporate other capacitor pad configurations (e.g. serial and/or parallel coupling) and not solely the transmon configuration. Some non-limiting examples of other qubit designs that can be used with the qubit-annealing system 100 include other types of charge qubits, phase qubits, flux qubits, fluxonium qubits, xmon qubits, quantronium qubits, and so on. In other words, even though the present disclosure explicitly discusses the details of how existing quantum circuitry of a transmon qubit (e.g., transmon capacitor pads 106) can be leveraged to perform localized annealing of the transmon qubit, those of skill in the art will appreciate that the systems and/or computer-implemented methods described herein can be implemented to leverage the existing quantum circuitry in other qubit designs to similarly facilitate annealing of those other qubits. For example, the systems and/or computer-implemented methods described herein can be implemented in conjunction with any type of quantum circuitry component, which component can receive electromagnetic signals/waves as an antenna, to facilitate qubit annealing.

Moreover, even though FIGS. 1A and 1B depict a qubit having only a single Josephson junction 104 and a single set of capacitor pads 106, those of skill in the art will understand that a qubit on the superconducting qubit chip 102 can comprise any number of Josephson junctions 104 and/or any number of capacitor pads 106. Furthermore, although FIGS. 1A and 1B depict only a single superconducting qubit on the superconducting qubit chip 102, those of skill in the art will appreciate that any number of superconducting qubits can be positioned on the superconducting qubit chip 102. Similarly, those of skill in the art will understand that additional quantum circuitry (e.g., readout resonators, flux bias lines, and so on) can be incorporated onto the superconducting qubit chip 102, wherein such additional quantum circuitry is conductively, capacitively, and/or inductively coupled to the Josephson junction 104 and/or the set of one or more capacitor pads 106.

In one or more embodiments, the system 100 can optionally include an emitter chip 108 (not depicted in FIG. 1A) and a radio frequency (RF) emitter 110 on the emitter chip 108. The emitter chip 108 can employ a printed circuit board construction and/or any other computer chip construction known in the art such that the RF emitter 110 can be operably soldered, etched, and/or attached onto the emitter chip 108. As shown in FIG. 1B, the emitter chip 108 can be positioned above, mounted above, mounted on, and/or mounted onto the superconducting qubit chip 102, such that the RF emitter 110 is above the superconducting qubit chip 102. In one or more other embodiments, the RF emitter 110 can be positioned directly or substantially directly vertically above the Josephson junction 104 and/or the set of one or more capacitor pads 106 (as shown in FIG. 1B). In still other embodiments, the RF emitter 110 can be positioned such that it is above the superconducting qubit chip 102 and not directly or substantially directly vertically above the Josephson junction 104 and/or the set of one or more capacitor pads 106.

As depicted in FIG. 1B, the RF emitter 110 can emit, generate, localize, and/or direct an electromagnetic signal 112 toward, on, and/or onto the set of one or more capacitor pads 106. In some embodiments, the RF emitter 110 can be a microstrip antenna (e.g., a patch antenna) that can be etched, soldered, and/or otherwise attached onto the emitter chip 108. In one or more other embodiments, the RF emitter 110 can be a dipole antenna, a monopole antenna, an array antenna, a loop antenna, an aperture antenna, a horn antenna, a parabolic antenna, a plasma antenna, and so on. In still other embodiments, the RF emitter 110 can be any device, antenna, and/or signal generator known in the art and that can propagate an electromagnetic signal through space/air (and/or otherwise across a medium lacking electrical conductors).

In one or more embodiments, the RF emitter 110 can be voltage and/or frequency tunable. That is, the RF emitter 110 can be controlled/manipulated (e.g., by controlling/manipulating an input alternating current and/or voltage that is fed to the RF emitter 110 to generate the propagating electromagnetic signal 112) so as to control/manipulate the characteristics of the electromagnetic signal 112. In some embodiments, the RF emitter 110 can control a duration, a frequency, and/or a magnitude of the electromagnetic signal 112 to generate a defined level of the annealing of the Josephson junction 104. For example, the input alternating current and/or voltage that is fed to the RF emitter 110 to generate the propagating electromagnetic signal 112 can be ceased (e.g., set to zero) to stop/cease the emitting of the electromagnetic signal 112. Thus, the RF emitter 110 can control a duration of the electromagnetic signal 112 by ceasing the emitting based on achieving the defined level of annealing (e.g., ceasing the emitting after a defined period of time has elapsed from the RF emitter 110 beginning to emit the electromagnetic signal 112). As another example, the oscillation frequency of the input alternating current and/or voltage that is fed to the RF emitter 110 to generate the propagating electromagnetic signal 112 can be increased, decreased, and/or otherwise controlled in order to increase, decrease, and/or otherwise control a frequency and/or wavelength of the electromagnetic signal 112. Thus, the RF emitter 110 can control a frequency and/or wavelength of the electromagnetic signal 112 to hasten and/or slow the annealing of the Josephson junction 104. As yet another example, the magnitude of the input alternating current and/or voltage that is fed to the RF emitter 110 to generate the propagating electromagnetic signal 112 can be increased, decreased, and/or otherwise controlled in order to increase, decrease, and/or otherwise control a magnitude of the electromagnetic signal 112. Thus, the RF emitter 110 can control a magnitude of the electromagnetic signal 112 to hasten and/or slow the annealing of the Josephson junction 104. In one or more embodiments, the RF emitter 110 can comprise one or more voltage-controlled oscillators that can be used to generate voltage tunable, current tunable, and/or frequency tunable signals to enable the RF emitter 110 to generate and control the electromagnetic signal 112. In some embodiments, the electromagnetic signal 112 can belong to the microwave region of the electromagnetic spectrum (e.g., have a frequency that is greater than or equal to 300 MegaHertz and lower than or equal to 300 GigaHertz). In some embodiments, the electromagnetic signal 112 can have a maximum power of 1 Watt to limit possible damage to the junction.

In one or more embodiments, the wavelength of the electromagnetic signal 112 can be adjusted (as explained above) to be greater than or approximately equal to four times a physical dimension of the set of capacitor pads 106 (e.g., four times the microstrip transmission length of the set of capacitor pads 106 acting as receiving patch antennas). Because the pads 106 can function as receiving patch antennas, they can efficiently receive signals/waves with wavelengths that are four times as long as the length of a single pad.

Similarly, in one or more embodiments, the RF emitter 110 can be sized to match the set of one or more capacitor pads 106 of the Josephson junction 104. That is, just as the electromagnetic signal 112 can be adjusted so as to be efficiently received by the pads 106, the RF emitter 110 can be sized/adjusted/modified so as to efficiently transmit the adjusted signal 112. Those of skill in the art will appreciate that such sizing can depend on the type of antenna implemented in the RF emitter 110. For example, if the RF emitter 110 incorporates a patch antenna, the patch antenna can be sized to have a microstrip transmission length that is a quarter of the wavelength of the electromagnetic signal 112.

In one or more embodiments, the RF emitter 110 can emit/generate the electromagnetic signal 112 such that the electromagnetic signal 112 is substantially isotropic (e.g., the electromagnetic signal 112 is radiated with substantially equal strength in every direction, thereby having a substantially spherical radiation pattern). In one or more other embodiments, the RF emitter 110 can emit/generate and/or localize/direct the electromagnetic signal 112 such that the electromagnetic signal 112 is omnidirectional (e.g., the electromagnetic signal 112 is radiated substantially symmetrically with respect to a given axis, thereby having a substantially torus-like radiation pattern). In still one or more other embodiments, the RF emitter 110 can emit/generate and/or localize/direct the electromagnetic signal 112 such that the electromagnetic signal 112 is directional (e.g., the electromagnetic signal 112 is radiated more strongly in a given direction than in other directions, thereby having a radiation pattern with at least one main lobe). In any case, the electromagnetic signal 112 can be emitted by the RF emitter 110 toward, onto, and/or on the set of one or more capacitor pads 106.

As shown in FIG. 1B, in one or more embodiments, the set of one or more capacitor pads 106 can receive and/or capture the electromagnetic signal 112 as the electromagnetic signal 112 propagates through space/air. In such case, each pad of the set of one or more capacitor pads 106 can function as a receiving antenna (e.g., a receiving patch antenna) that responds to being exposed to the electromagnetic signal 112. As described below, the reception of the electromagnetic signal 112 by the capacitor pads 106 can cause annealing of the Josephson junction 104. Although the present disclosure explicitly describes qubit annealing by leveraging existing capacitor pads (e.g., the set of one or more capacitor pads 106) that are coupled to the qubit (e.g., coupled to the Josephson junction 104), those of skill in the art will appreciate that any existing circuitry that is on the superconducting qubit chip 102, that is capacitively, conductively, and/or inductively coupled to a Josephson junction, and that can receive electromagnetic radiation, waves, and/or signals propagating through space/air can be leveraged to implement one or more embodiments of the present invention.

To better understand how the set of one or more capacitor pads 106 (and/or any other circuitry on the superconducting qubit chip 102 that can receive the electromagnetic signal 112) can facilitate annealing of the Josephson junction 104, consider FIG. 2. FIG. 2 illustrates an equivalent circuit diagram of an example, non-limiting system that facilitates antenna-based qubit annealing in accordance with one or more embodiments described herein. With reference now to FIG. 2, there is illustrated an example circuit diagram 200 that shows how the capacitor pads 106 and the Josephson junction 104 respond upon receiving the electromagnetic signal 112.

First, consider a high-level explanation. As shown, even though the transmon capacitor pads 106 make up a capacitor that is coupled in parallel to the Josephson junction 104, the separate pads of the set of one or more capacitor pads 106 (each labeled 106 in FIG. 2) can be considered as individually coupled in series (instead of collectively in parallel) with the Josephson junction 104. As mentioned above, each pad 106 can function as a receiving antenna, thereby receiving/capturing the electromagnetic signal 112. Based on receiving the electromagnetic signal 112, the capacitor pads 106 can generate an alternating current and/or voltage at or within a defined distance from the Josephson junction 104 (e.g., in the circuit lines electrically coupling the set of capacitor pads 106 to the Josephson junction 104). The generated alternating current and/or voltage can then heat the Josephson junction 104, thereby annealing the Josephson junction 104.

Now, consider a more detailed explanation. As mentioned above, the individual pads of the set of capacitor pads 106 can be thought of as being individually coupled in series to the Josephson junction 104. As also mentioned above, each pad 106 can receive/capture the electromagnetic signal 112, thereby functioning as a receiving antenna. When exposed to the electromagnetic signal 112, the electrons in each of the capacitor pads 106 can begin to oscillate according to the characteristics/properties (e.g., frequency, wavelength, amplitude, magnitude, and so on) of the electromagnetic signal 112. This oscillation of electrons in the set of capacitor pads 106 can generate/induce an alternating current 206 and/or an alternating voltage 208 in each pad 106, wherein the alternating current 206 and/or the alternating voltage 208 have substantially the same (and/or related) frequency and/or magnitude as the electromagnetic signal 112. Thus, each separate pad 106, based upon excitation by the electromagnetic signal 112, can be considered a separate oscillating signal source 202 (e.g., an alternating current and/or voltage source), wherein each oscillating signal source 202 can generate an alternating current 206 and/or an alternating voltage 208. Because FIG. 2 depicts two separate pads 106, FIG. 2 depicts two corresponding oscillating signal sources 202, each one generating an alternating current 206 and/or an alternating voltage 208. However, those of skill in the art will appreciate that additional and/or fewer capacitor pads (and therefore oscillating signal sources) can be incorporated. Overall, the effect of emitting, via the RF emitter 110, the electromagnetic signal 112 onto the set of one or more capacitor pads 106 is to cause each pad 106 to separately replicate (or substantially replicate) the electromagnetic signal 112 as an alternating current 206 and/or an alternating voltage 208 that flows through the pads 106 themselves and through the circuit lines coupling the capacitor pads 106 to the Josephson junction 104, rather than as waves/signals propagating through space/air.

In one or more embodiments, the frequency and/or magnitude of the electromagnetic wave 112 can be controlled so as to control the frequency and/or magnitude of the alternating current 206 and/or the alternating voltage 208. In some embodiments, the magnitude of the alternating voltage 208 can be limited to no more than 50 millivolts so as to avoid damaging the Josephson junction 104.

Now, each alternating current 206 and/or alternating voltage 208 is generated at a corresponding oscillating signal source 202 (e.g., at a corresponding pad 106) and can run from the corresponding oscillating signal source 202 to the Josephson junction 104 through the circuit lines electrically connecting the corresponding oscillating signal source 202 to the Josephson junction 104. In FIG. 2, "Z" represents the impedance 204 from each oscillating signal source 202 to the Josephson junction 104 (that is, impedance from each pad 106 to the junction 104). In some embodiments, the capacitor pads 106 can be symmetric, and so the two impedances 204 can be equal. In such case, the complex formulation of Ohm's law (e.g., V=I*Z) yields that the two alternating currents 206 can also be equal, and can add up at the Josephson junction 104 (since the two alternating currents 206 run in opposite directions, as shown in FIG. 2). In other embodiments, the pads 106 can be asymmetric, and so the two impedances 204 can be unequal. In such case, the complex formulation of Ohm's law yields that the two alternating currents 206 can also be unequal, and thus can cancel each other slightly at the Josephson junction 104. In either scenario, the alternating currents 206 oscillate back and forth through the circuit lines leading from the oscillating signal sources 202 (e.g., from the capacitor pads 106) to the Josephson junction 104, and such oscillation can continue for as long as the RF emitter 110 emits the electromagnetic signal 112.

As known from the complex power equation (e.g., P=V*I), the oscillation of the alternating current 206 can dissipate power in the form of heat, thereby heating the circuit lines connecting the oscillating signal sources 202 to the Josephson junction 104. The oscillating signal sources 202 (e.g., the pads 106) can, themselves, also heat up during this oscillation. This heating of the capacitor pads 106 and the lines coupling the capacitor pads 106 to the Josephson junction 104 can then heat the Josephson junction 104 (e.g., via thermal conduction). Such heating can alter the physical and/or electrical properties of the Josephson junction 104 (e.g., its critical current, its normal state resistance, and so on), thereby correspondingly altering a transition frequency of the qubit comprising the Josephson junction 104. That is, various embodiments of the present invention leverage the existing quantum circuitry on the superconducting qubit chip to anneal qubits, thereby addressing/solving the prior art problem of having to incorporate specialized tuning circuitry onto the superconducting qubit chip to tune qubit frequencies.

The Josephson junction 104 can be heated in this way to achieve a defined and/or desired level of annealing. As one of skill in the art will understand, the defined level of annealing can be based on a defined and/or desired transition frequency which the Josephson junction 104 is to achieve. For example, if the Josephson junction 104 is to have a transition frequency of A, then it must be annealed at B intensity for C amount of time. The duration, frequency, and/or magnitude of the electromagnetic signal 112 can be controlled/adjusted so as to provide the required B intensity for C amount of time. Furthermore, the level of annealing performed on the Josephson junction 104 can be monitored by monitoring the normal state electrical resistance of the Josephson junction 104 (e.g., based on the Ambegaokar-Baratoff formula relating critical current to normal state resistance). Those of skill in the art will appreciate that such monitoring can be implemented by systems and methods known in the art (e.g., via an Ohmmeter, and so on).

As explained, FIG. 2 depicts a circuit diagram 200 that illustrates the electrical response of the capacitor pads 106 and the Josephson junction 104 to the reception of the electromagnetic signal 112. As mentioned above, although the drawings (including FIG. 2) depict the set of one or more capacitor pads 106 in a transmon configuration (e.g., pads of a capacitor, which capacitor is coupled in parallel to the Josephson junction 104), the systems and/or methods described herein can be used with various other electrical components coupled to the Josephson junction 104 in lieu of the capacitor pads 106 (e.g., any component that can receive the electromagnetic signal 112 to generate an alternating current 206 and/or alternating voltage 208 can suffice). Those of skill in the art will appreciate that different but analogous circuit diagrams can be created to describe the electrical properties of such embodiments.

Figure 3:
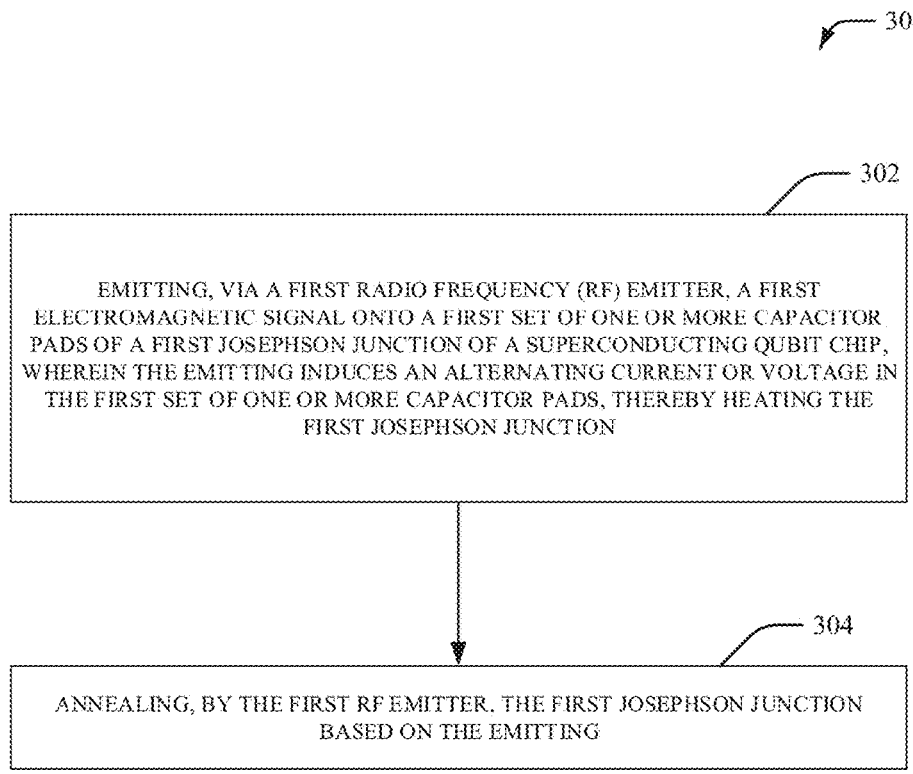
FIG. 3 illustrates a flow diagram of an example, non-limiting computer-implemented method that facilitates antenna-based qubit annealing in accordance with one or more embodiments described herein.

Now, consider FIG. 3. FIG. 3 illustrates a flow diagram of an example, non-limiting computer-implemented method that facilitates antenna-based qubit annealing in accordance with one or more embodiments described herein. That is, FIG. 3 depicts a computer-implemented method 300 of annealing qubits/Josephson junctions that can be facilitated, for example, by the systems discussed above and/or illustrated in FIGS. 1A, 1B, and 2. Those of skill in the art will appreciate, however, that other systems, devices, and/or apparatus can be used to implement the computer-implemented method 300.

At step 302, a first radio frequency (RF) emitter can emit a first electromagnetic signal onto a first set of one or more capacitor pads of a first Josephson junction of a superconducting qubit chip. As explained above, the first set of one or more capacitor pads can function as receiving antennas to capture/receive the first electromagnetic signal. Based on receipt of the first electromagnetic signal by the first set of one or more capacitor pads, the emitting can induce an alternating current or voltage in the first set of one or more capacitor pads (e.g., via exciting the electrons of the first set of one or more capacitor pads). The alternating current or voltage can then dissipate energy in the form of heat as they oscillate back and forth in the first set of one or more capacitor pads and in the circuit lines electrically coupling the first set of one or more capacitor pads to the first Josephson junction, thereby heating the first Josephson junction (e.g., via thermal conduction). At step 304, the first RF emitter can anneal the first Josephson junction based on the emitting. For example, the first RF emitter can sustain the emitting of the first electromagnetic signal to induce a defined level of heating (and therefore a defined level of annealing) of the first Josephson junction. As explained above, such heating of the first Josephson junction can change its properties (e.g., critical current, normal state resistance), thereby changing a transition frequency between a ground state and an excited state of a superconducting qubit comprising the first Josephson junction.

Again, those of skill in the art will appreciate that the computer-implemented method 300 is not limited to being used only in conjunction with transmon capacitor pads. Indeed, those of skill in the art will understand that the first electromagnetic signal can be emitted onto any type of circuitry/component that is coupled to the first Josephson junction, that can receive the first electromagnetic signal, and that can generate an alternating current and/or voltage based on receiving the first electromagnetic signal to heat the first Josephson junction. Indeed, one or more embodiments of the present invention are not limited solely to using transmon capacitor pads.

Figure 4:
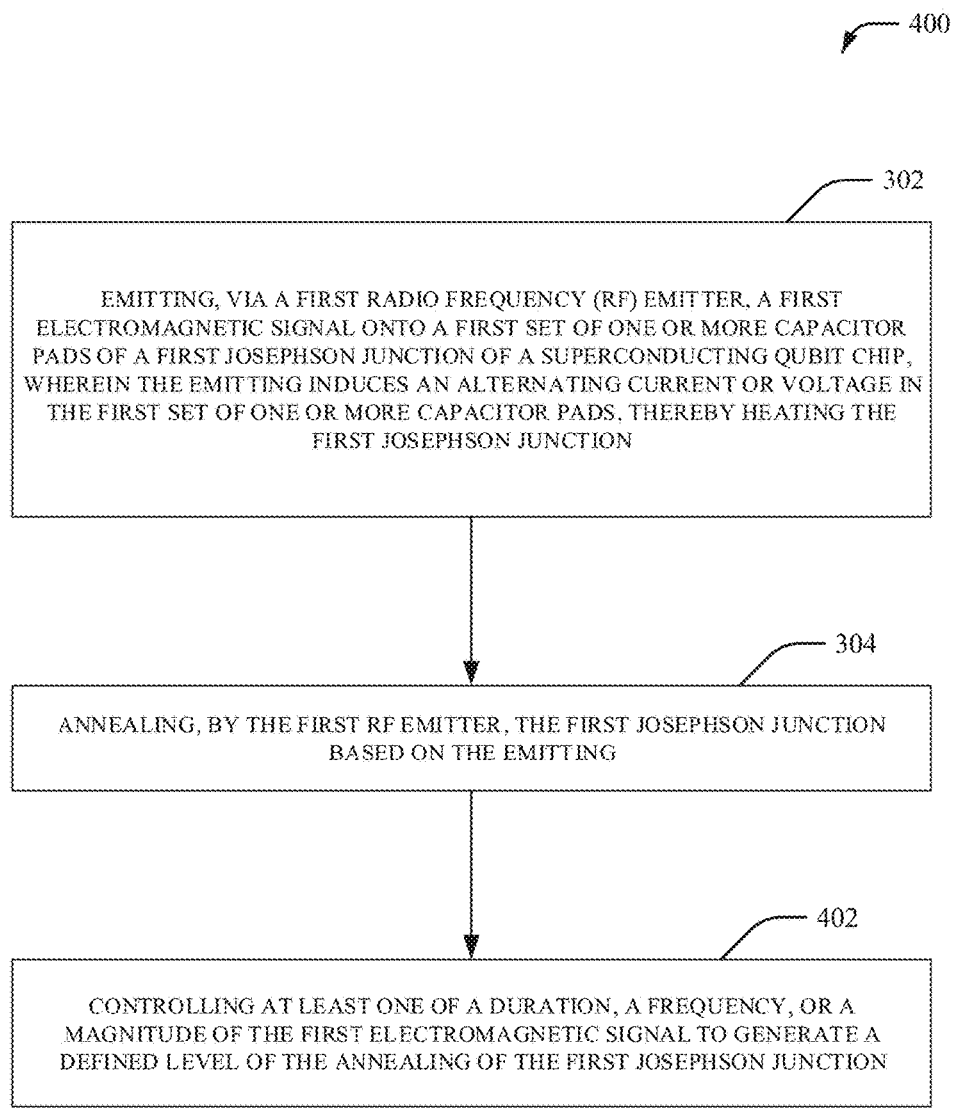
FIG. 4 illustrates a flow diagram of an example, non-limiting computer-implemented method that facilitates controlling an electromagnetic signal to achieve a defined level of antenna-based qubit annealing in accordance with one or more embodiments described herein.

Now, consider FIG. 4. FIG. 4 illustrates a flow diagram of an example, non-limiting computer-implemented method that facilitates controlling an electromagnetic signal to achieve a defined level of antenna-based qubit annealing in accordance with one or more embodiments described herein. That is, FIG. 4 depicts a computer-implemented method 400 that can comprise the computer-implemented method 300 of annealing qubits/Josephson junctions and that can further include an additional step of controlling the properties of an emitted electromagnetic signal to correspondingly control the annealing of a targeted Josephson junction.

At step 302, as explained above, a first radio frequency (RF) emitter can emit a first electromagnetic signal onto a first set of one or more capacitor pads of a first Josephson junction of a superconducting qubit chip, wherein the emitting can induce an alternating current or voltage in the first set of one or more capacitor pads, thereby heating the first Josephson junction. At step 304, also as explained above, the first RF emitter can anneal the first Josephson junction based on the emitting.

Now, at step 402, the first RF emitter can control at least one of a duration, a frequency, or a magnitude of the first electromagnetic signal to generate a defined level of the annealing of the first Josephson junction. Such a step can be implemented by a first RF emitter that is voltage and/or frequency tunable. That is, the output of the first RF emitter (e.g., the first electromagnetic signal) can be controlled/manipulated by controlling/manipulating an input of the first RF emitter (e.g., an input electronic signal and/or input alternating current/voltage). For example, in one or more embodiments, the first RF emitter can function like a transmission antenna known in the art, which radiates electromagnetic waves based on receiving an alternating current/voltage at its input terminals. Moreover, the input alternating current/voltage and the first electromagnetic signal can have the same and/or substantially related frequencies and/or magnitudes. Thus, by controlling the properties of the input alternating current/voltage, the properties of the first electromagnetic signal generated by the first RF emitter can correspondingly be controlled.

So, for example, ceasing to create and feed the input alternating current/voltage to the first RF emitter can cease the emission of the first electromagnetic signal. This, in turn, can allow for the duration of the first electromagnetic signal to be controlled (e.g., ceasing to emit the first electromagnetic signal once a defined amount of time has elapsed since the emitting began, wherein the defined amount of time can be an amount of time required to achieve a defined level of annealing at a certain magnitude and/or frequency). As another example, modulating a frequency of the input alternating current/voltage can correspondingly modulate a frequency of the first electromagnetic signal (e.g., since the input alternating current/voltage and the first electromagnetic signal can have the same and/or substantially related frequencies). This, in turn, can allow for the frequency of the first electromagnetic signal to be controlled so as to hasten, slow, and/or otherwise manipulate the rate and/or extent of annealing of the first Josephson junction. As yet another example, modulating a magnitude (e.g., absolute value of amplitude) of the input alternating current/voltage can correspondingly modulate a magnitude of the first electromagnetic signal (e.g., since the input alternating current/voltage and the first electromagnetic signal can have the same and/or substantially related magnitudes). This, in turn, can allow for the magnitude of the first electromagnetic signal to be controlled so as to hasten, slow, and/or otherwise manipulate the rate and/or extent of annealing of the first Josephson junction.

In one or more embodiments, the input alternating current/voltage of the first RF emitter can be created and fed to the first RF emitter by systems/methods known in the art (e.g., by a voltage-controlled oscillator, and so on). In some embodiments, the first electromagnetic signal can belong to the microwave region of the electromagnetic spectrum (e.g., can have a frequency that is greater than or equal to 300 MegaHertz and lower than or equal to 300 GigaHertz). In some embodiments, the first electromagnetic signal can have a maximum power of 1 Watt to limit possible damage to the junction.

Figure 5:
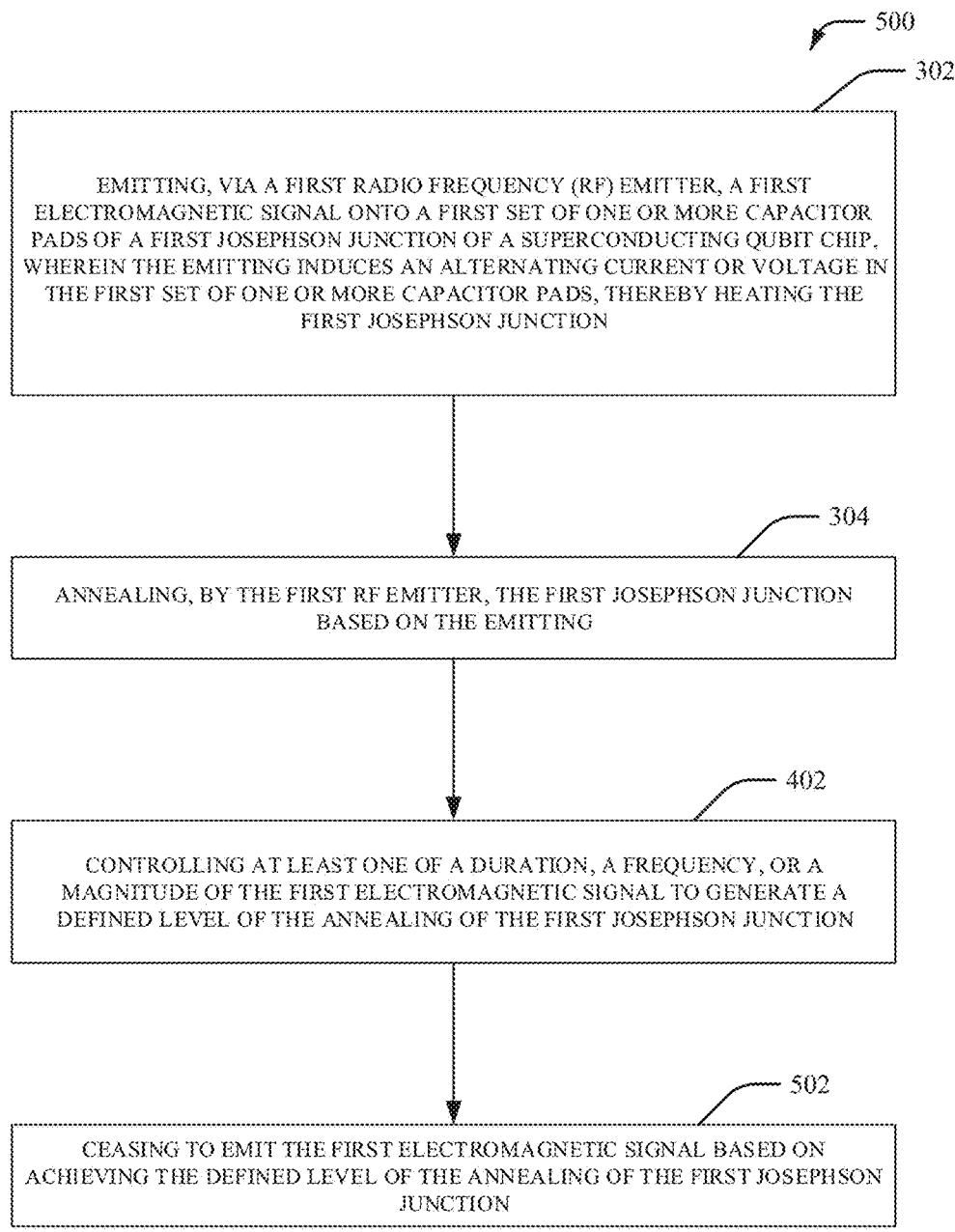
FIG. 5 illustrates a flow diagram of an example, non-limiting computer-implemented method that facilitates ceasing to emit an electromagnetic signal based on achieving a defined level of antenna-based qubit annealing in accordance with one or more embodiments described herein.

Now, consider FIG. 5. FIG. 5 illustrates a flow diagram of an example, non-limiting computer-implemented method that facilitates ceasing to emit an electromagnetic signal based on achieving a defined level of antenna-based qubit annealing in accordance with one or more embodiments described herein. That is, FIG. 5 depicts a computer-implemented method 500 that can comprise the computer-implemented method 400 and that can further include an additional step of ceasing to emit an electromagnetic signal once annealing of a Josephson junction is complete.

The first three steps can be as described above. At step 302, a first radio frequency (RF) emitter can emit a first electromagnetic signal onto a first set of one or more capacitor pads of a first Josephson junction of a superconducting qubit chip, wherein the emitting induces an alternating current or voltage in the first set of one or more capacitor pads, thereby heating the first Josephson junction. At step 304, the first RF emitter can anneal the first Josephson junction based on the emitting. At step 402, the first RF emitter can control at least one of a duration, a frequency, or a magnitude of the first electromagnetic signal to generate a defined level of the annealing of the first Josephson junction.

Now, at step 502, the first RF emitter can cease to emit the first electromagnetic signal based on (and/or in response to) achieving the defined level of the annealing of the first Josephson junction. That is, once the first Josephson junction has been sufficiently annealed, the first RF emitter can stop emitting the first electromagnetic signal (as described above), thereby preventing further annealing of the first Josephson junction. The defined level of annealing (e.g., the amount of annealing required) can depend on industrial context and/or applicable circumstances. Moreover, and as mentioned above, the level of annealing of the first Josephson junction can be monitored by monitoring the normal state resistance of the first Josephson junction (e.g., via an Ohmmeter).

Figure 6:
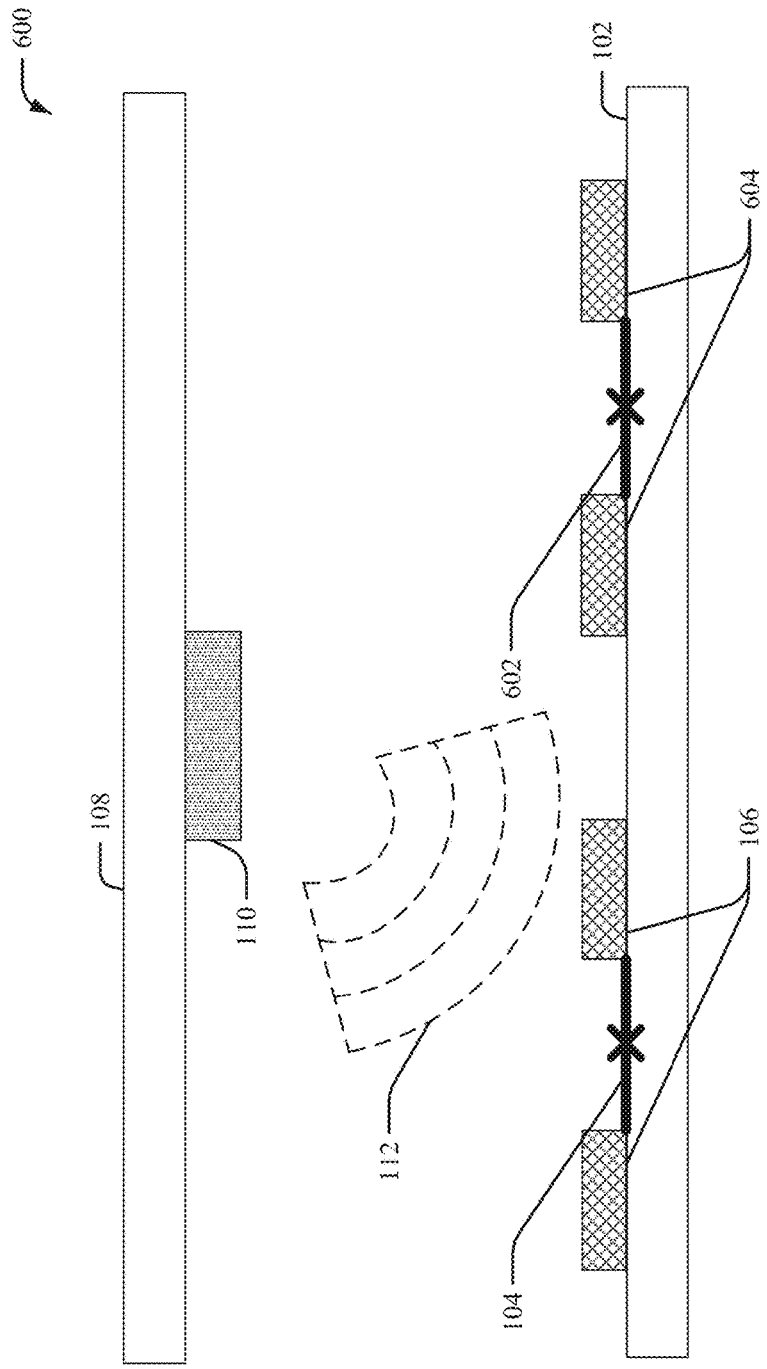
FIG. 6 illustrates a side-view schematic of an example, non-limiting system that facilitates localized antenna-based qubit annealing in accordance with one or more embodiments described herein.

Now, consider FIG. 6. FIG. 6 illustrates a side-view schematic of an example, non-limiting system that facilitates localized antenna-based qubit annealing in accordance with one or more embodiments described herein. As shown, the qubit annealing system 600 can comprise the superconducting qubit chip 102, the Josephson junction 104, the first set of one or more capacitor pads 106, the emitter chip 108, and the RF emitter 110 which can emit/generate the electromagnetic signal 112 (also referred to as electromagnetic wave 112), substantially as described above.

As shown, the qubit annealing system 600 can further comprise a second Josephson junction 602 on the superconducting qubit chip 102 and having a second set of one or more capacitor pads 604. Moreover, the RF emitter 110 can localize/direct the electromagnetic signal 112 toward/on/onto the set of capacitor pads 106 and away from the second set of capacitor pads 604 to prevent annealing of the second Josephson junction 602 by the electromagnetic signal 112. In other words, due to the localizing/directing, the electromagnetic signal 112 can be received by the set of one or more capacitor pads 106 and not by the second set of one or more capacitor pads 604, thereby annealing the Josephson junction 104 and not annealing the second Josephson junction 602. Thus, the Josephson junction 104 can be independently annealed without causing unwanted annealing of the second Josephson junction 602 and/or other neighboring Josephson junctions on the superconducting qubit chip 102. An advantage of these one or more embodiments is the facilitation of independent and/or localized annealing of qubits (e.g., altering one qubit without altering neighboring qubits), thereby enabling optimal frequency allocation and reducing frequency collisions and/or quantum cross-talk.

In one or more embodiments, the RF emitter 110 can be a directional antenna/transmitter as known in the art such that it can localize/direct the electromagnetic signal 112 more strongly in a particular direction (e.g., toward the set of pads 106) than in other directions. For example, the RF emitter 110 can comprise an aperture antenna, a parabolic antenna, a helical antenna, a Yagi antenna, a horned antenna, a phase antenna array, and so on.

In one or more embodiments, the RF emitter 110 can be outfitted with electronic actuators so as to swivel, rotate, and/or otherwise change directions/orientations such that it can localize/direct the electromagnetic signal 112 away from the set of pads 106 and toward/on/onto the second set of pads 604, thereby annealing the second Josephson junction 602 without further annealing the Josephson junction 104. Again, this enables multiple qubits on a multi-qubit chip to undergo independent and localized annealing, such that each qubit can receive its required level of annealing without unwantedly affecting the annealing levels of neighboring qubits. This can help to facilitate optimal frequency allocation, thereby reducing quantum cross-talk.

Figure 7:
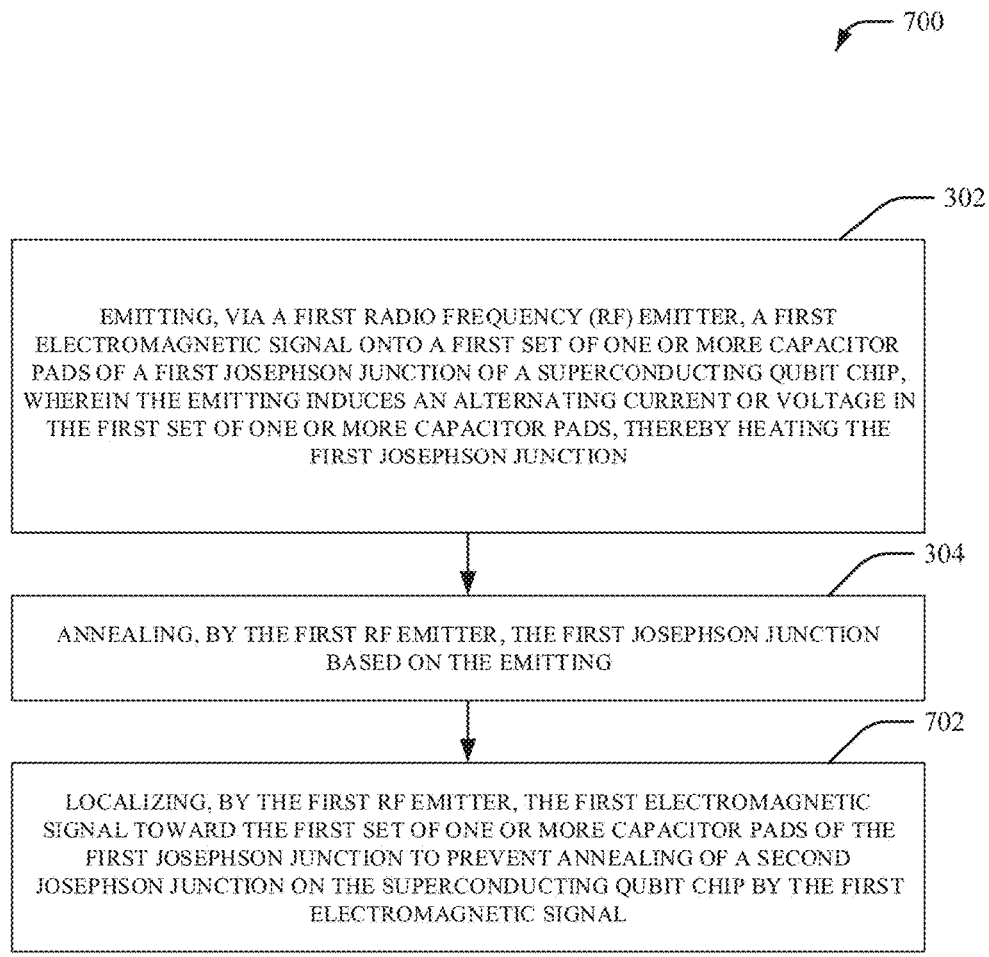
FIG. 7 illustrates a flow diagram of an example, non-limiting computer-implemented method that facilitates localizing antenna-based qubit annealing in accordance with one or more embodiments described herein.

Now, consider FIG. 7. FIG. 7 illustrates a flow diagram of an example, non-limiting computer-implemented method that facilitates localizing antenna-based qubit annealing in accordance with one or more embodiments described herein. That is, FIG. 7 depicts a computer-implemented method 700 that can comprise the computer-implemented method 300 and that can further include a step for localizing an electromagnetic signal toward one set of capacitor pads and away from another set.

At step 302, a first radio frequency (RF) emitter can emit a first electromagnetic signal onto a first set of one or more capacitor pads of a first Josephson junction of a superconducting qubit chip, wherein the emitting induces an alternating current or voltage in the first set of one or more capacitor pads, thereby heating the first Josephson junction. At step 304, the first RF emitter can anneal the first Josephson junction based on the emitting.

Now, at step 702, the first RF emitter can localize the first electromagnetic signal toward the first set of one or more capacitor pads of the first Josephson junction to prevent annealing of a second Josephson junction on the superconducting qubit chip by the first electromagnetic signal. As described above in conjunction with FIG. 6, this can enable each qubit on a multi-qubit chip to be individually annealed, wherein such individual annealing does not substantially affect, and is not substantially affected by, individual annealing of neighboring qubits on the multi-qubit chip. Again, an advantage of these one or more embodiments is the facilitation of independent and localized annealing of multiple qubits on a superconducting qubit chip (e.g., affecting desired qubits on the chip without accidentally affecting neighboring qubits on the chip), thereby improving frequency allocation and reducing the likelihood of frequency collisions and/or quantum cross-talk. Such localizing/directing can be accomplished by incorporating a directional antenna into the first RF emitter (e.g., an aperture antenna, a parabolic antenna, a helical antenna, a Yagi antenna, a horned antenna, a phase antenna array, and so on).

Figure 8:
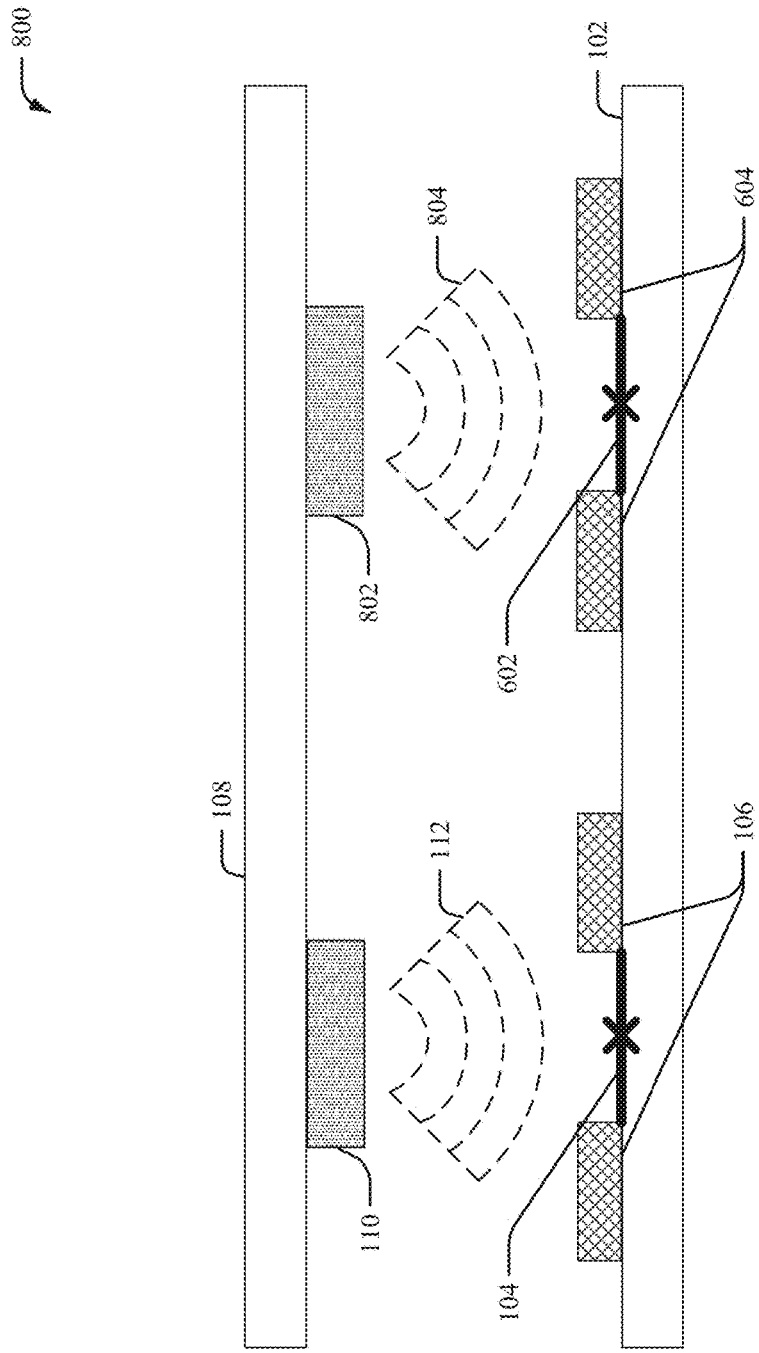
FIG. 8 illustrates a side-view schematic of an example, non-limiting system that facilitates antenna-based qubit annealing of multiple qubits in accordance with one or more embodiments described herein.

Now, consider FIG. 8. FIG. 8 illustrates a side-view schematic of an example, non-limiting system that facilitates antenna-based qubit annealing of multiple qubits in accordance with one or more embodiments described herein. As shown, the qubit annealing system 800 can comprise the superconducting qubit chip 102, the Josephson junction 104, the set of one or more capacitor pads 106, the emitter chip 108, the RF emitter 110 which can emit/generate and/or localize/direct the electromagnetic signal 112, and the second Josephson junction 602 having the second set of one or more capacitor pads 604, substantially as described above.

As shown, the qubit annealing system 800 can also comprise a second RF emitter 802 on the emitter chip 108 and/or otherwise positioned above the superconducting qubit chip 102. The second RF emitter can emit/generate and localize/direct a second electromagnetic signal 804 toward/on/onto the second set of one or more capacitor pads 604, thereby annealing the second Josephson junction 602. Additionally, the second RF emitter 802 can emit/generate and localize/direct the second electromagnetic signal 804 independently of and concurrently or sequentially with the RF emitter 110 emitting and localizing the electromagnetic signal 112, thereby respectively facilitating independent and concurrent or sequential localized annealing of the Josephson junction 104 and the second Josephson junction 602. Because the electromagnetic signal 112 and the second electromagnetic signal 804 can each be independently localized/directed by their respective RF emitters, they can propagate through space/air and/or be received by their respective target qubits/capacitor pads without substantially interfering with each other. In other words, the electromagnetic signal 112 can propagate so as to not anneal the second Josephson junction 602, and the second electromagnetic signal 804 can propagate so as to not anneal the Josephson junction 104. Moreover, not only can the Josephson junction 104 and the second Josephson junction 602 be independently annealed via localized emission of the electromagnetic signals 112 and 804 (such that the two Josephson junctions 104 and 602 can achieve distinct and/or different levels of annealing, and such that the annealing of one junction does not affect the annealing of the other), but they can also be annealed simultaneously/concurrently, thereby saving time and constituting a significant advantage over serial annealing.

Additionally, as shown in FIG. 8, the RF emitter 110 can be positioned above the set of one or more capacitor pads 106 of the Josephson junction 104 and the second RF emitter 802 can be positioned above the second set of one or more capacitor pads 604 of the second Josephson junction 602. This can help to localize/direct the electromagnetic signals 112 and 804 such that they are received only by their respectively targeted Josephson junctions (e.g., signal 112 received by pads 106 of Josephson junction 104 and not by pads 604 of junction 602; signal 804 received by pads 604 of junction 602 and not by pads 106 of Josephson junction 104). As used herein, electromagnetic signal 804 may be referred to as electromagnetic wave 804.

In one or more embodiments, the qubit annealing system 800 can be generalized to describe parallel/concurrent annealing of multiple qubits on a multi-qubit chip. For example, the generalized system can comprise a superconducting qubit chip (e.g., 102) having one or more qubits (e.g., 104 and 602). Moreover, the generalized system can comprise a semiconductor chip (e.g., 108) having one or more electromagnetic transmitters (e.g., 110 and 802). Furthermore, the semiconductor chip can be mounted on the superconducting qubit chip (e.g., the emitter chip 108 is mounted above the superconducting qubit chip 102) so that at least one of the one or more qubits has above it a corresponding one of the one or more electromagnetic transmitters (e.g., RF emitter 110 can be directly above Josephson junction 104). The corresponding one of the one or more electromagnetic transmitters (e.g., 110) can emit a localized electromagnetic wave (e.g. 112) toward a set of one or more capacitor pads (e.g., 106) of the at least one of the one or more qubits (e.g., 104), thereby annealing a Josephson junction of the at least one of the one or more qubits (e.g., 104). Again, an advantage of these one or more embodiments is the facilitation of concurrent and independent annealing of multiple qubits on a multi-qubit chip (e.g., simultaneously annealing two qubits to two distinct and/or different levels of annealing).

In one or more embodiments, the generalized system can comprise at least two of the one or more electromagnetic transmitters (e.g., 110 and 802) that can concurrently or sequentially emit at least two electromagnetic waves (e.g., 112 and 804) toward at least two of the one or more qubits (e.g., 104 and 602). Moreover, the at least two of the one or more electromagnetic transmitters (e.g., 110 and 802) can independently control at least one of a duration, a frequency, or a magnitude (as described above) of the at least two electromagnetic waves (112 and 804) to achieve a defined level of annealing of the at least two of the one or more qubits (e.g., 104 and 602). That is, in some embodiments, a duration, a frequency, and/or a magnitude of the electromagnetic signal 112 can be different than a duration, a frequency, and/or a magnitude of the second electromagnetic signal 804. Thus, the generalized system can facilitate independent and concurrent or sequential localized annealing of at least two Josephson junctions of the at least two of the one or more qubits (e.g., 104 and 602).

Figure 9:
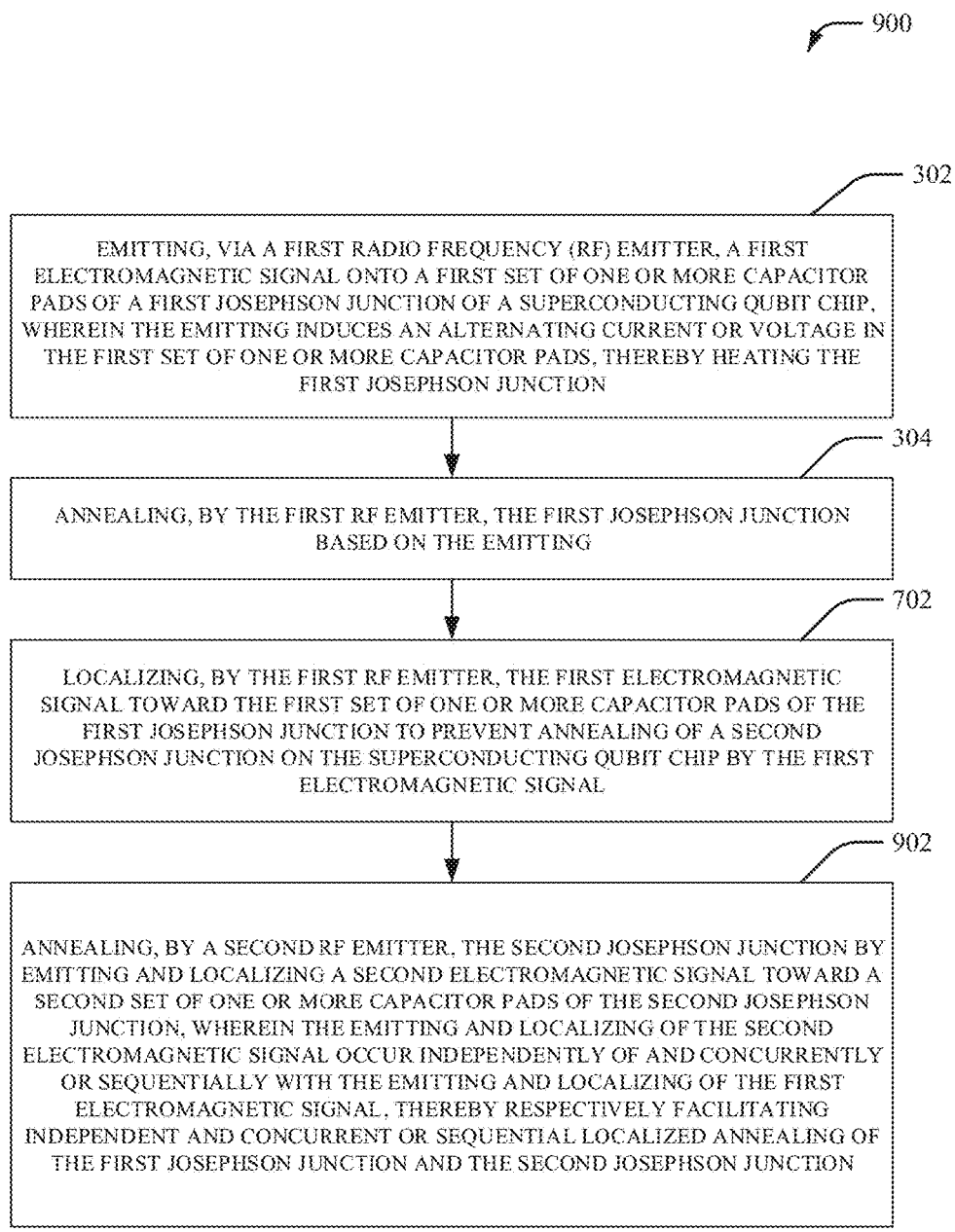
FIG. 9 illustrates a flow diagram of an example, non-limiting computer-implemented method that facilitates annealing multiple qubits by antenna-based qubit annealing in accordance with one or more embodiments described herein.

Now, consider FIG. 9. FIG. 9 illustrates a flow diagram of an example, non-limiting computer-implemented method that facilitates annealing multiple qubits by antenna-based qubit annealing in accordance with one or more embodiments described herein. That is, FIG. 9 depicts a computer-implemented method 900 that can comprise the computer-implemented method 700 and that can further include a step for annealing multiple qubits/Josephson junctions.

At step 302, as explained, a first radio frequency (RF) emitter can emit a first electromagnetic signal onto a first set of one or more capacitor pads of a first Josephson junction on a superconducting qubit chip, wherein the emitting induces an alternating current or voltage in the first set of one or more capacitor pads, thereby heating the first Josephson junction. At step 304, the first RF emitter can anneal the first Josephson junction based on the emitting. At step 702, the first RF emitter can localize the first electromagnetic signal toward the first set of one or more capacitor pads of the first Josephson junction to prevent annealing of a second Josephson junction on the superconducting qubit chip by the first electromagnetic signal.

Now, at step 902, a second RF emitter can anneal the second Josephson junction by emitting and localizing a second electromagnetic signal toward a second set of one or more capacitor pads of the second Josephson junction. Moreover, the emitting and localizing of the second electromagnetic signal can occur independently of and concurrently or sequentially with the emitting and localizing of the first electromagnetic signal, thereby respectively facilitating independent and concurrent or sequential localized annealing of the first Josephson junction and the second Josephson junction. The computer-implemented method 900 can be implemented by, for example, the system 800 (and/or the generalized system) depicted in FIG. 8. Again, such independent (e.g., the durations, frequencies, and/or magnitudes of the first and second electromagnetic signals can be independently controllable) and concurrent annealing of multiple qubits saves time and enables each qubit to receive a distinct level of annealing, thereby improving frequency allocation and reducing quantum cross-talk, thereby constituting a notable advantage over the prior art.

Figure 10:
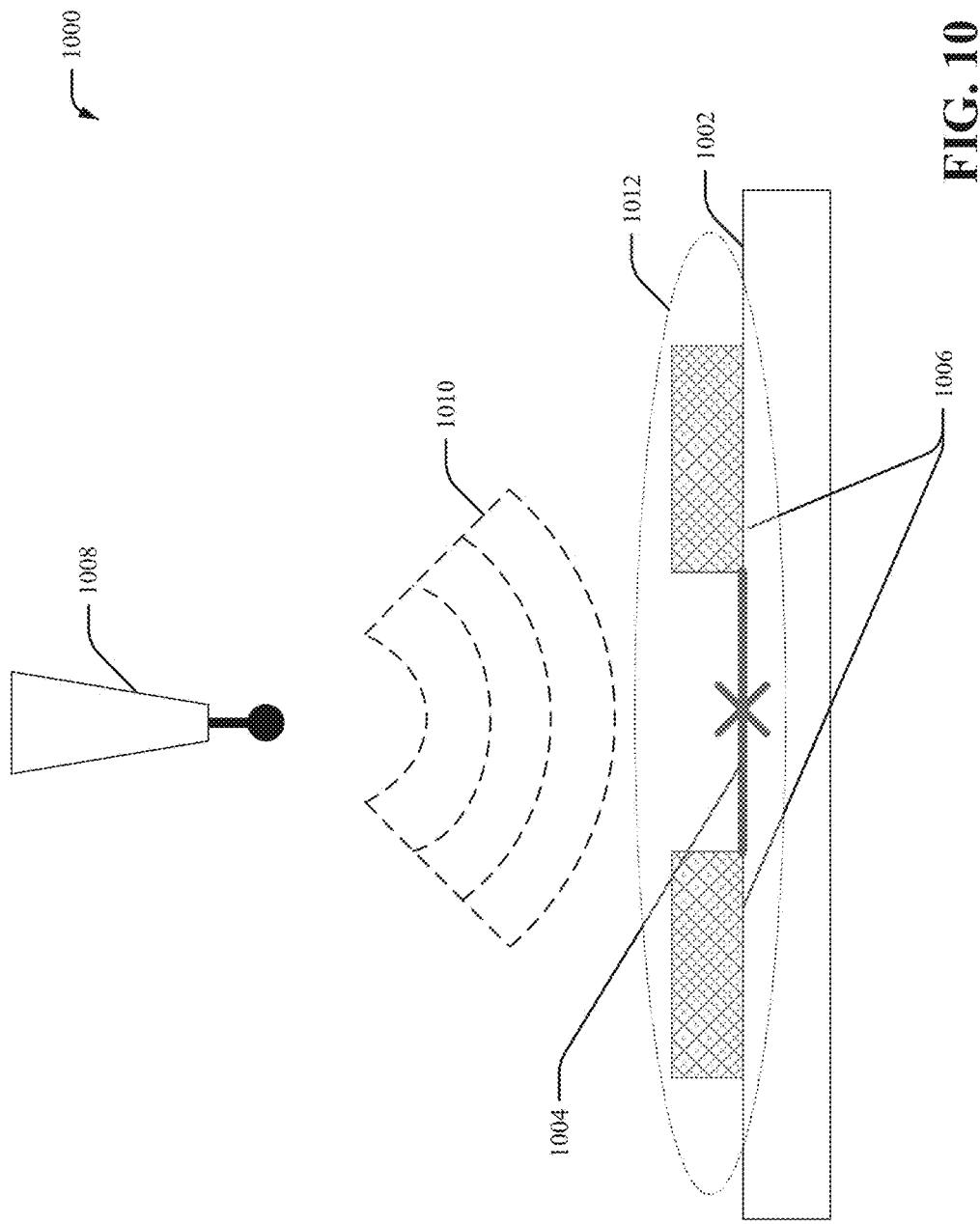
FIG. 10 illustrates a side-view schematic of an example, non-limiting system that facilitates antenna-based qubit annealing in accordance with one or more embodiments described herein.

Now, consider FIG. 10. FIG. 10 illustrates a side-view schematic of an example, non-limiting system that facilitates antenna-based qubit annealing in accordance with one or more embodiments described herein.

As shown, the qubit annealing system 1000 can comprise a superconducting qubit chip 1002 having a first qubit 1012. As shown in FIG. 10, the first qubit 1012 can comprise a first Josephson junction 1004 and a first set of one or more capacitor pads 1006 (e.g. pads 1006 of a capacitor that is in parallel with the first Josephson junction 1004). The qubit annealing system 1000 can also comprise a first antenna 1008 located above the superconducting qubit chip 1002 and that can emit/generate a first electromagnetic wave 1010 onto the first set of one or more capacitor pads 1006. Substantially as explained above, the first electromagnetic wave 1010 can heat the first qubit 1012, thereby annealing the first Josephson junction 1004 of the first qubit 1012.

In one or more embodiments, the first antenna 1008 can be any type of antenna, signal generator, and/or oscillator that can propagate the first electromagnetic wave 1010 through space/air. Moreover, the first antenna 1008 can be positioned on an emitter chip that is mounted above the superconducting qubit chip 1002 (like in FIGS. 1A and 1B). However, in other embodiments, the first antenna 1008 can be mounted onto a robotic manipulator, arm, and/or actuator such that it can be positioned/moved about the superconducting qubit chip 1002 (e.g., moved in a plane parallel to the plane of the superconducting qubit chip 1002). In such case, the first antenna 1008 can be moved such that it is substantially directly vertically above the first qubit 1012 on the superconducting qubit chip 1002, or the first antenna 1008 can be moved such that it is substantially directly vertically above another qubit (and/or other circuitry) on the superconducting qubit chip 1002. In still other embodiments, the first antenna 1008 can be mounted onto a robotic manipulator, arm, and/or actuator such that it can be moved vertically (e.g., moved in the direction normal to the plane of the superconducting qubit chip 1002). In such case, the vertical distance between the first antenna 1008 and the superconducting qubit chip 1002 can be modulated/controlled so as to help modulate/control the amount of circuitry (e.g., the number of qubits) on the superconducting qubit chip 1002 that receive the first electromagnetic wave 1010. For example, moving the first antenna 1008 farther away from the superconducting qubit chip 1002 can cause more circuitry on the superconducting qubit chip 1002 than just the first qubit 1012 to receive the first electromagnetic wave 1010. Conversely, moving the first antenna 1008 closer to the superconducting qubit chip 1002 can cause less circuitry on the superconducting qubit chip 1002 to receive the first electromagnetic wave 1010. This is because the spanned arc length of a wave/signal/beam is directly proportional to the radius/distance traveled by the wave/signal/beam (e.g., $s=r*\theta$). In still one or more other embodiments, the first antenna 1008 can be stationary.

Those of skill in the art will understand that much of the above discussion regarding technical aspects and advantages of FIGS. 1A and 1B can be applied to the qubit annealing system 1000 of FIG. 10.

Figure 11:
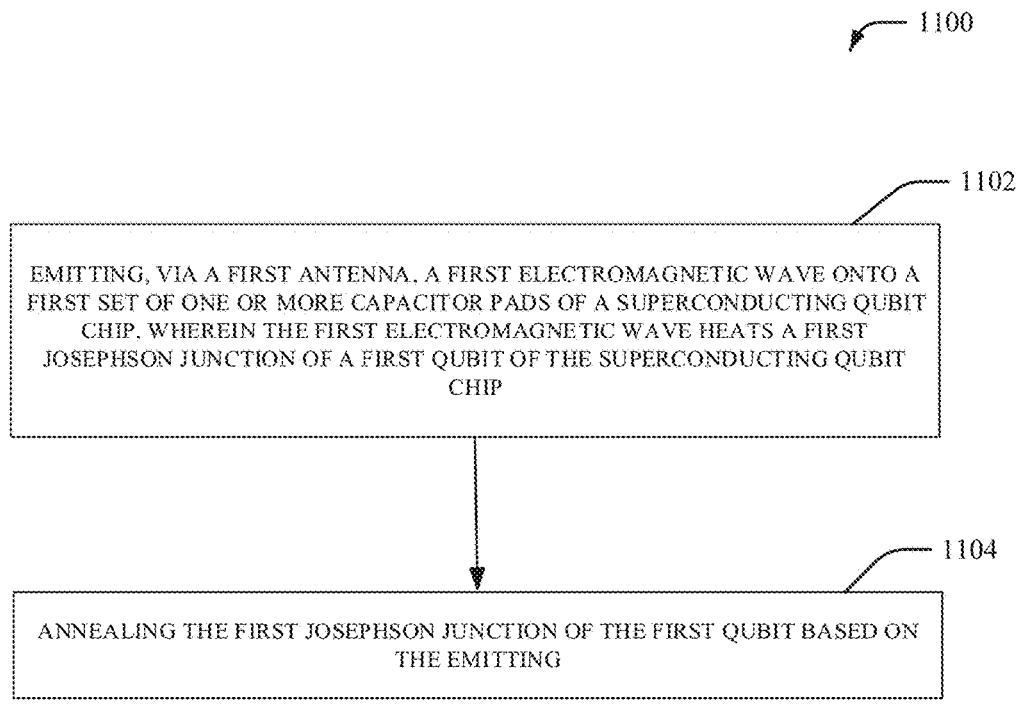
FIG. 11 illustrates a flow diagram of an example, non-limiting computer-implemented method that facilitates antenna-based qubit annealing in accordance with one or more embodiments described herein.

Now, consider FIG. 11. FIG. 11 illustrates a flow diagram of an example, non-limiting computer-implemented method that facilitates antenna-based qubit annealing in accordance with one or more embodiments described herein. That is, FIG. 11 depicts the computer-implemented method 1100 of annealing qubits that can be facilitated, for example, by the system discussed above and/or illustrated in FIG. 10. Those of skill in the art will appreciate, however, that other systems, devices, and/or apparatus can be used to implement the computer-implemented method 1100.

At step 1102, a first antenna can emit a first electromagnetic wave onto a first set of one or more capacitor pads of a superconducting qubit chip, wherein the first electromagnetic wave heats a first Josephson junction of a first qubit of the superconducting qubit chip. At step 1104, the first antenna can anneal the first Josephson junction of the first qubit based on the emitting. In this way, one or more qubits on the superconducting qubit chip can be independently annealed by a controllable antenna (e.g., controllable vertical and/or lateral position of the antenna as well as controllable duration/frequency/magnitude of the generated electromagnetic wave). Those of skill in the art will appreciate that the above discussion regarding electromagnetic signals/ waves generating alternating currents/voltages in capacitor pads to heat and anneal qubits/Josephson junctions applies to the computer-implemented method 1100. Moreover, much of the discussion regarding technical aspects and advantages of FIG. 3 above can apply to FIG. 11.

Figure 12:
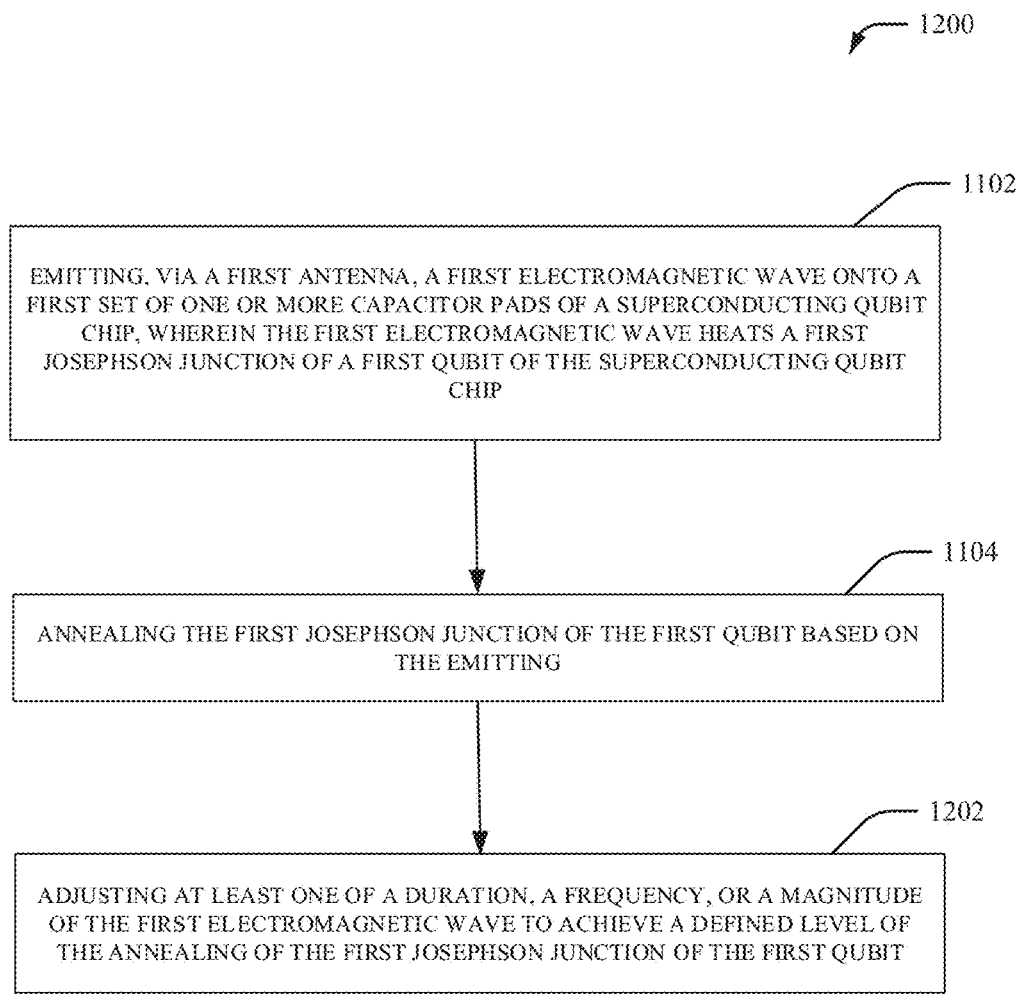
FIG. 12 illustrates a flow diagram of an example, non-limiting computer-implemented method that facilitates adjusting an electromagnetic wave to achieve a defined level of antenna-based qubit annealing in accordance with one or more embodiments described herein.

Now, consider FIG. 12. FIG. 12 illustrates a flow diagram of an example, non-limiting computer-implemented method that facilitates adjusting an electromagnetic wave to achieve a defined level of antenna-based qubit annealing in accordance with one or more embodiments described herein. That is, FIG. 12 depicts a computer-implemented method 1200 that can comprise the computer-implemented method 1100 and that can further include a step for adjusting the properties of an electromagnetic wave to correspondingly control the annealing of a targeted qubit.

At step 1102, as described above, a first antenna can emit a first electromagnetic wave onto a first set of one or more capacitor pads of a superconducting qubit chip, wherein the first electromagnetic wave heats a first Josephson junction of a first qubit of the superconducting qubit chip. At step 1104, also as described above, the first antenna can anneal the first Josephson junction of the first qubit based on the emitting.

Now, at step 1202, the first antenna can adjust at least one of a duration, a frequency, or a magnitude of the first electromagnetic wave to achieve a defined level of the annealing of the first Josephson junction of the first qubit. As mentioned above, this can help to facilitate independent and localized annealing of one or more qubits on the superconducting qubit chip (e.g., the different qubits can undergo varying levels of annealing depending on their own anneal requirements), thereby improving frequency allocation on the superconducting qubit chip and commensurately reducing quantum cross-talk. Those of skill in the art will appreciate that the above discussion of technical aspects and advantages in conjunction with FIG. 4 can apply to FIG. 12.

Figure 13:
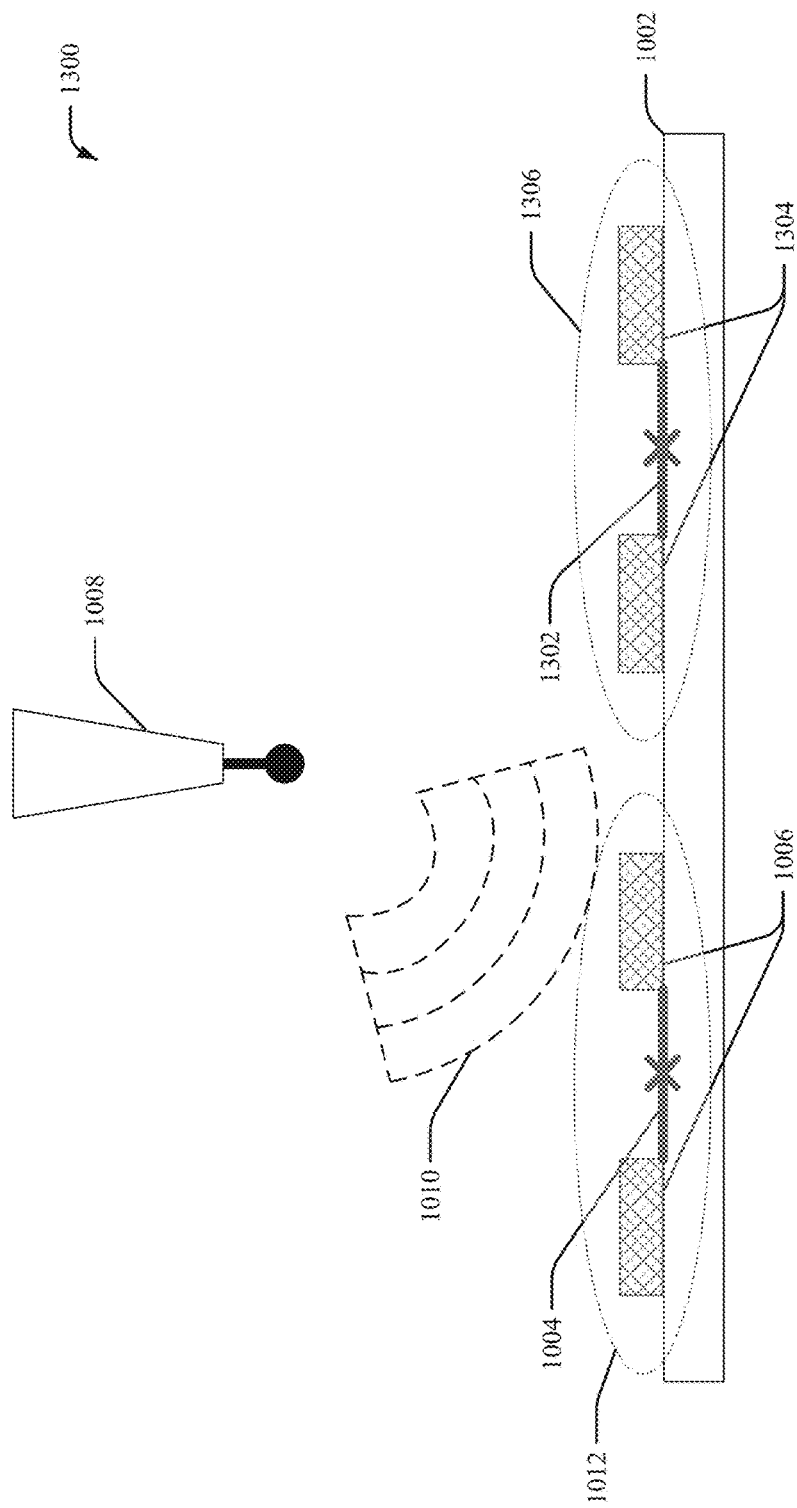
FIG. 13 illustrates a side-view schematic of an example, non-limiting system that facilitates directed antenna-based qubit annealing in accordance with one or more embodiments described herein.

Now, consider FIG. 13. FIG. 13 illustrates a side-view schematic of an example, non-limiting system that facilitates directed antenna-based qubit annealing in accordance with one or more embodiments described herein. As shown, the qubit annealing system 1300 can comprise the superconducting qubit chip 1002, a first qubit 1012 having a first Josephson junction 1004 and a first set of one or more capacitor pads 1006, and a first antenna 1008 that can emit/generate a first electromagnetic wave 1010.

As shown, the qubit annealing system 1300 can also comprise a second qubit 1306 on the superconducting qubit chip 1002. The second qubit 1306 can have a second set of one or more capacitor pads 1304 and a second Josephson junction 1302. Moreover, the first antenna 1008 can direct/ localize the first electromagnetic wave toward the first set of one or more capacitor pads 1006 of the first qubit 1012 and away from the second set of one or more capacitor pads 1304 of the second qubit 1306 to avoid annealing of the second Josephson junction 1302 of the second qubit 1306 by the first electromagnetic wave 1010. That is, due to the directing/localizing, the first electromagnetic wave 1010 can be received by the first set of one or more capacitor pads 1006 and not by the second set of one or more capacitor pads 1304, thereby annealing the first Josephson junction 1004 of the first qubit 1012 and not annealing the second Josephson junction 1302 of the second qubit 1306. Thus, the first qubit 1012 can be independently annealed without causing unwanted annealing of the second qubit 1306 and/or other neighboring qubits on the superconducting qubit chip 1002 (e.g., independent and/or localized annealing of qubits).

Those of skill in the art will appreciate that much of the above discussion regarding technical aspects and advantages (e.g., localized/directed annealing) in conjunction with FIG. 6 can apply to FIG. 13. So, in one or more embodiments, the first antenna 1008 can be a directional antenna/transmitter as known in the art such that it can localize/direct the first electromagnetic wave 1010 more strongly in a particular direction (e.g., toward the first set of pads 1006) than in other directions. For example, the first antenna 1008 can comprise an aperture antenna, a parabolic antenna, a helical antenna, a Yagi antenna, a horned antenna, a phase antenna array, and so on. In some embodiments, the first antenna 1008 can be outfitted with electronic actuators such that it can rotate, swivel, and/or otherwise change the principal direction in which it directs/localizes the first electromagnetic wave 1010.

Figure 14:
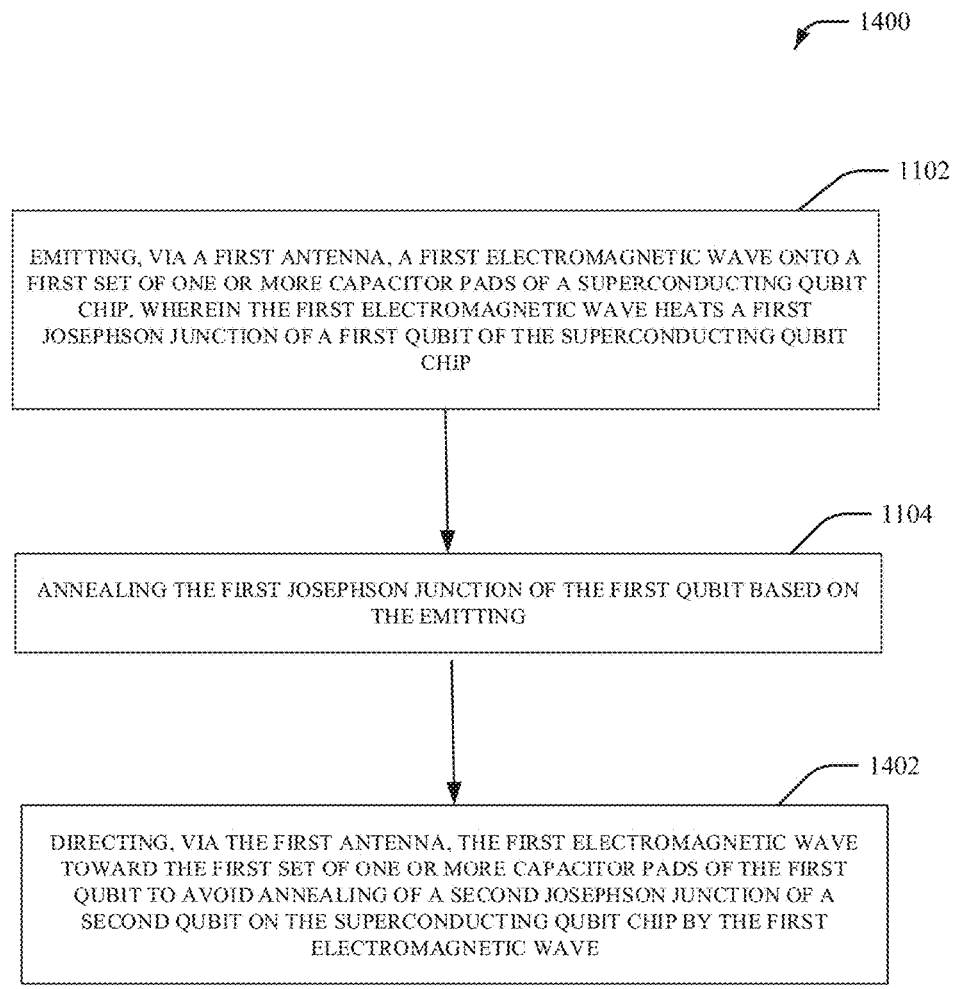
FIG. 14 illustrates a flow diagram of an example, non-limiting computer-implemented method that facilitates directing antenna-based qubit annealing in accordance with one or more embodiments described herein.

Now, consider FIG. 14. FIG. 14 illustrates a flow diagram of an example, non-limiting computer-implemented method that facilitates directing antenna-based qubit annealing in accordance with one or more embodiments described herein. That is, FIG. 14 depicts a computer-implemented method 1400 that can comprise the computer-implemented method 1100 and that can further include a step for directing/localizing an electromagnetic wave toward one set of capacitor pads and away from another set.

At step 1102, as explained above, a first antenna can emit a first electromagnetic wave onto a first set of one or more capacitor pads of a superconducting qubit chip, wherein the first electromagnetic wave heats a first Josephson junction of a first qubit of the superconducting qubit chip. At step 1104, also as explained above, the first antenna can anneal the first Josephson junction of the first qubit based on the emitting.

Now, at step 1402, the first antenna can direct/localize the first electromagnetic wave toward the first set of one or more capacitor pads of the first qubit to avoid annealing of a second Josephson junction of a second qubit on the superconducting qubit chip by the first electromagnetic wave. Those of skill in the art will appreciate that much of the discussion of technical aspects and advantages in conjunction with FIG. 7 can apply to FIG. 14. Again, this can help to facilitate independent and localized annealing of multiple qubits on a superconducting qubit chip, thereby improving frequency allocation and reducing the likelihood of frequency collisions and/or quantum cross-talk. Such localizing/directing can be accomplished by incorporating a directional antenna component into the first antenna (e.g., an aperture antenna, a parabolic antenna, a helical antenna, a Yagi antenna, a horned antenna, a phase antenna array, and so on).

Figure 15:
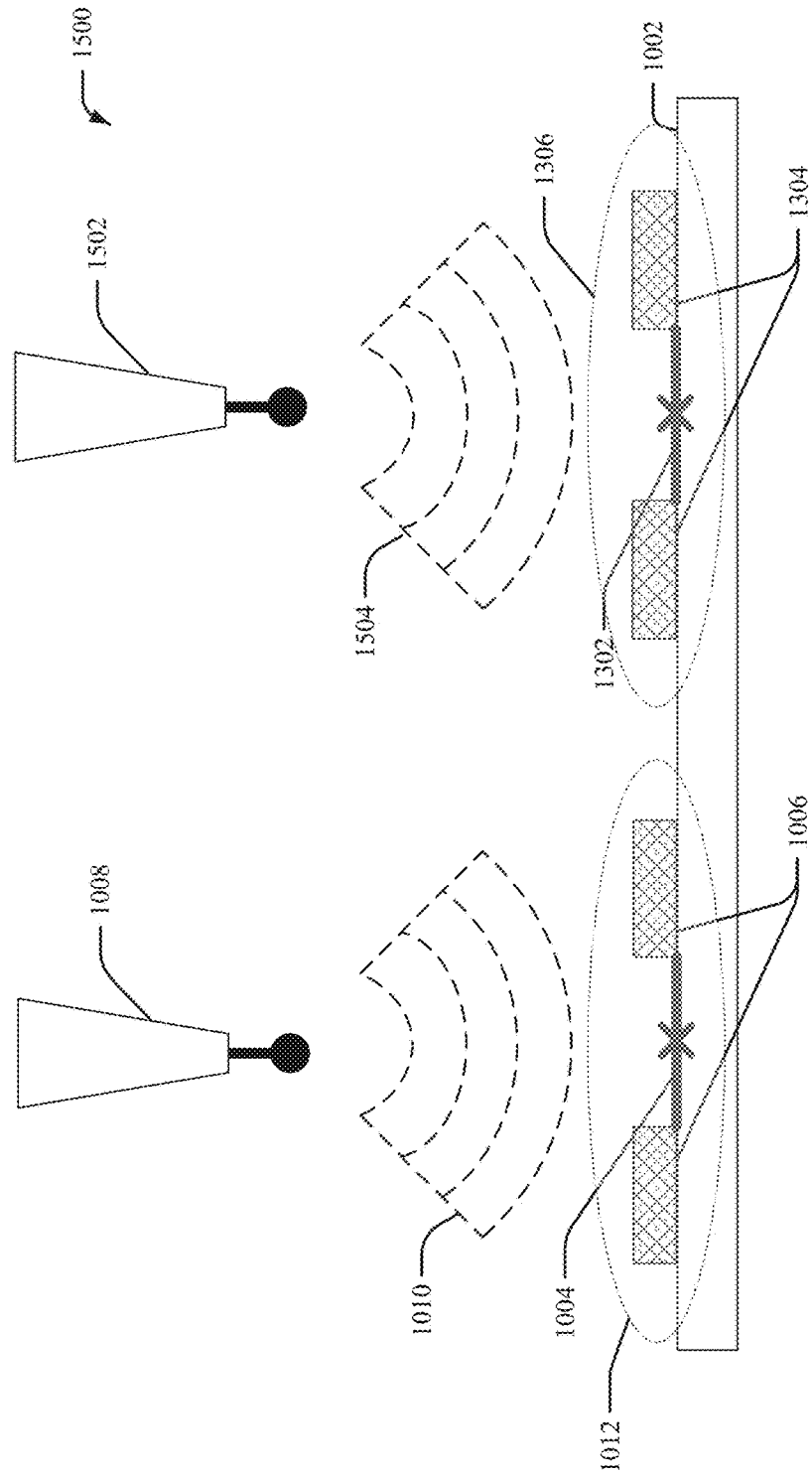
FIG. 15 illustrates a side-view schematic of an example, non-limiting system that facilitates annealing multiple qubits by antenna-based qubit annealing in accordance with one or more embodiments described herein.

Now, consider FIG. 15. FIG. 15 illustrates a side-view schematic of an example, non-limiting system that facilitates annealing multiple qubits by antenna-based qubit annealing in accordance with one or more embodiments described herein. As shown, the qubit annealing system 1500 can comprise the superconducting qubit chip 1002, the first qubit 1012 having a first Josephson junction 1004 and a first set of one or more capacitor pads 1006, the first antenna 1008 that can emit the first electromagnetic wave 1010, and the second qubit 1306 having a second Josephson junction 1302 and a second set of one or more capacitor pads 1304.

As shown, the qubit annealing system 1500 can further comprise a second antenna 1502 located above the superconducting qubit chip 1002. The second antenna 1502 can emit/generate and direct/localize a second electromagnetic wave 1504 toward the second set of one or more capacitor pads 1304 of the second qubit 1306, thereby annealing the second Josephson junction 1302 of the second qubit 1306. Moreover, the second antenna 1502 can emit/generate and direct/localize the second electromagnetic wave 1504 independently of (e.g., can control duration, frequency, and/or magnitude independently of) and concurrently or sequentially with the first antenna 1008 emitting/generating and directing/localizing the first electromagnetic wave 1010. This can facilitate independent and concurrent or sequential localized annealing of the first Josephson junction 1004 of the first qubit 1012 and the second Josephson junction 1302 of the second qubit 1306. Those of skill in the art will appreciate that much of the discussion of technical aspects and advantages regarding FIG. 8 can apply to FIG. 15.

Figure 16:
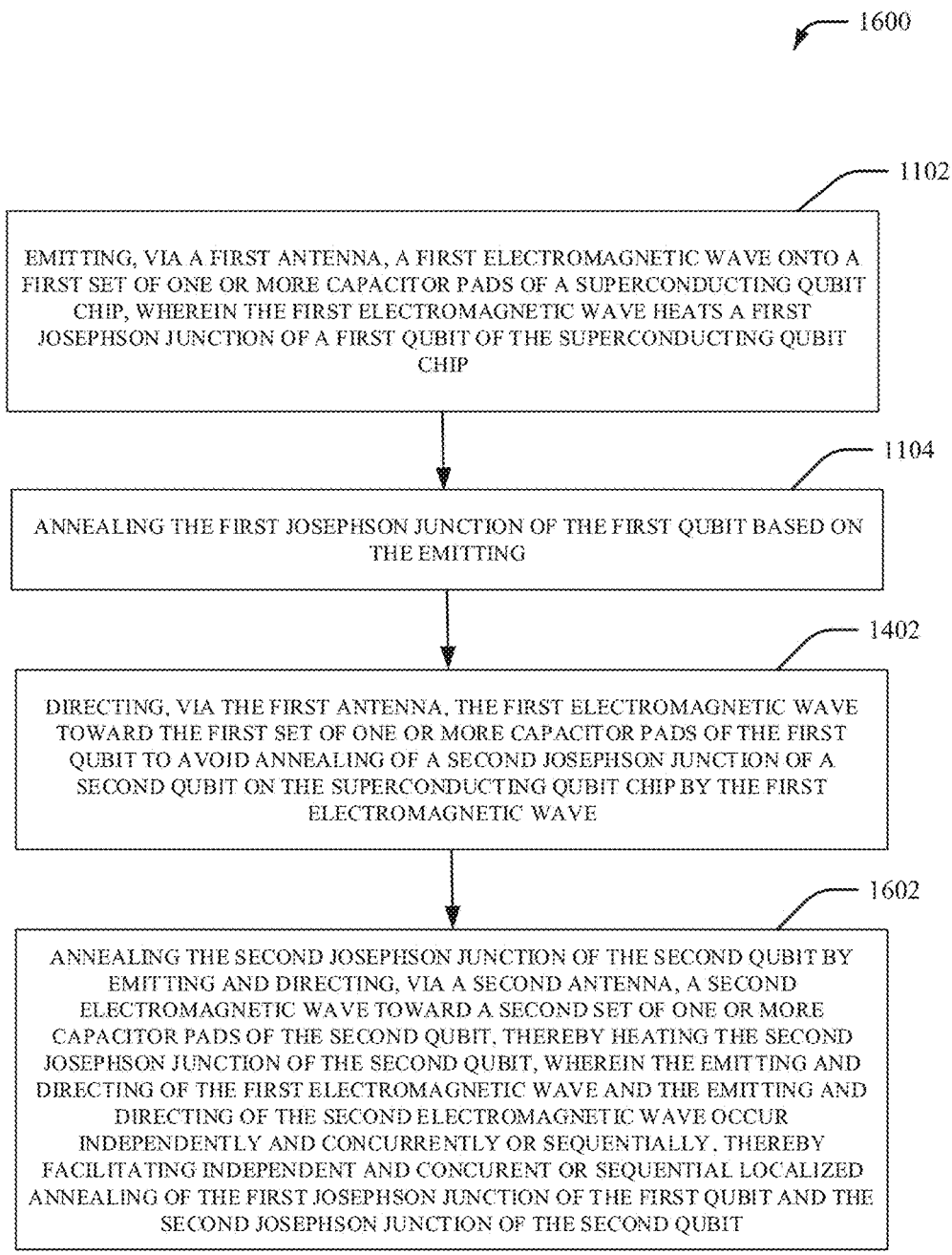
FIG. 16 illustrates a flow diagram of an example, non-limiting computer-implemented method that facilitates annealing multiple qubits by antenna-based qubit annealing in accordance with one or more embodiments described herein.

Now, consider FIG. 16. FIG. 16 illustrates a flow diagram of an example, non-limiting computer-implemented method that facilitates annealing multiple qubits by antenna-based qubit annealing in accordance with one or more embodiments described herein. That is, FIG. 16 depicts a computer-implemented method 1600 that can comprise the computer-implemented method 1400 and that can further include a step for annealing multiple qubits on a multi-qubit chip.

At step 1102, as described above, a first antenna can emit a first electromagnetic wave onto a first set of one or more capacitor pads of a superconducting qubit chip, wherein the first electromagnetic wave heats a first Josephson junction of a first qubit of the superconducting qubit chip. At step 1104, also explained above, the first antenna can anneal the first Josephson junction of the first qubit based on the emitting. At step 1402, also as described above, the first antenna can direct/localize the first electromagnetic wave toward the first set of one or more capacitor pads of the first qubit to avoid annealing of a second Josephson junction of a second qubit on the superconducting qubit chip by the first electromagnetic wave.

Now, at step 1602, a second antenna can anneal the second Josephson junction of the second qubit by emitting/generating and directing/localizing a second electromagnetic wave toward a second set of one or more capacitor pads of the second qubit, thereby heating the second Josephson junction of the second qubit. Moreover, the emitting and directing of the first electromagnetic wave and the emitting and directing of the second electromagnetic wave can occur independently and concurrently or sequentially, thereby facilitating independent and concurrent or sequential localized annealing of the first Josephson junction of the first qubit and the second Josephson junction of the second qubit. Those of skill in the art will appreciate that much of the discussion of technical aspects and advantages regarding FIG. 9 can apply to FIG. 16.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 17:
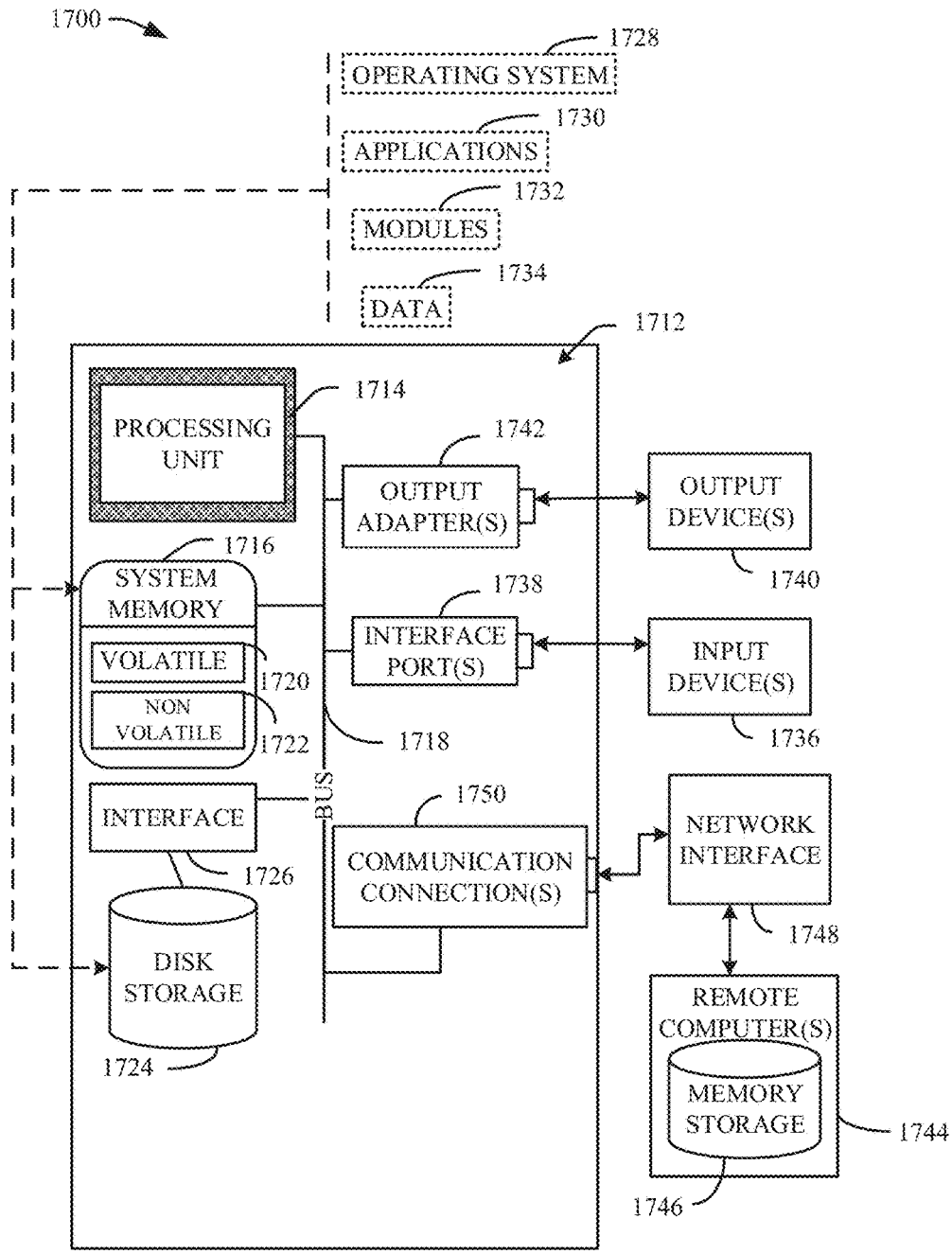
FIG. 17 illustrates a block diagram of an example, non-limiting operating environment in which one or more embodiments described herein can be facilitated.

In order to provide a context for the various aspects of the disclosed subject matter, FIG. 17 as well as the following discussion are intended to provide a general description of a suitable environment in which the various aspects of the disclosed subject matter can be implemented. FIG. 17 illustrates a block diagram of an example, non-limiting operating environment in which one or more embodiments described herein can be facilitated. Repetitive description of like elements employed in other embodiments described herein is omitted for sake of brevity. With reference to FIG. 17, a suitable operating environment 1700 for implementing various aspects of this disclosure can also include a computer 1712. The computer 1712 can also include a processing unit 1714, a system memory 1716, and a system bus 1718. The system bus 1718 couples system components including, but not limited to, the system memory 1716 to the processing unit 1714. The processing unit 1714 can be any of various available processors. Dual microprocessors and other multiprocessor architectures also can be employed as the processing unit 1714. The system bus 1718 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1716 can also include volatile memory 1720 and nonvolatile memory 1722. The basic input/output system (BIOS), containing the basic routines to transfer information between elements within the computer 1712, such as during start-up, is stored in nonvolatile memory 1722. By way of illustration, and not limitation, nonvolatile memory 1722 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1720 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1712 can also include removable/non-removable, volatile/non-volatile computer storage media. FIG. 17 illustrates, for example, a disk storage 1724. Disk storage 1724 can also include, but is not limited to, devices like a magnetic disk drive, floppy disk drive, tape drive, Jaz drive, Zip drive, LS-100 drive, flash memory card, or memory stick. The disk storage 1724 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1724 to the system bus 1718, a removable or non-removable interface is typically used, such as interface 1726. FIG. 17 also depicts software that acts as an intermediary between users and the basic computer resources described in the suitable operating environment 1700. Such software can also include, for example, an operating system 1728. Operating system 1728, which can be stored on disk storage 1724, acts to control and allocate resources of the computer 1712. System applications 1730 take advantage of the management of resources by operating system 1728 through program modules 1732 and program data 1734, e.g., stored either in system memory 1716 or on disk storage 1724. It is to be appreciated that this disclosure can be implemented with various operating systems or combinations of operating systems. A user enters commands or information into the computer 1712 through input device(s) 1736. Input devices 1736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1714 through the system bus 1718 via interface port(s) 1738. Interface port(s) 1738 include, for example, a serial port, a parallel port, a game port, and a universal serial bus (USB). Output device(s) 1740 use some of the same type of ports as input device(s) 1736. Thus, for example, a USB port can be used to provide input to computer 1712, and to output information from computer 1712 to an output device 1740. Output adapter 1742 is provided to illustrate that there are some output devices 1740 like monitors, speakers, and printers, among other output devices 1740, which require special adapters. The output adapters 1742 include, by way of illustration and not limitation, video and sound cards that provide a means of connection between the output device 1740 and the system bus 1718. It should be noted that other devices and/or systems of devices provide both input and output capabilities such as remote computer(s) 1744.

Computer 1712 can operate in a networked environment using logical connections to one or more remote computers, such as remote computer(s) 1744. The remote computer(s) 1744 can be a computer, a server, a router, a network PC, a workstation, a microprocessor based appliance, a peer device or other common network node and the like, and typically can also include many or all of the elements described relative to computer 1712. For purposes of brevity, only a memory storage device 1746 is illustrated with remote computer(s) 1744. Remote computer(s) 1744 is logically connected to computer 1712 through a network interface 1748 and then physically connected via communication connection 1750. Network interface 1748 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1750 refers to the hardware/software employed to connect the network interface 1748 to the system bus 1718. While communication connection 1750 is shown for illustrative clarity inside computer 1712, it can also be external to computer 1712. The hardware/software for connection to the network interface 1748 can also include, for exemplary purposes only, internal and external technologies such as, modems including regular telephone grade modems, cable modems and DSL modems, ISDN adapters, and Ethernet cards.

The present invention may be a system, a computer-implemented method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, computer-implemented methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A computer-implemented method, comprising:
    emitting, via a first radio frequency (RF) emitter, a first electromagnetic signal onto a first set of one or more capacitor pads of a first Josephson junction of a superconducting qubit chip, wherein the emitting induces an alternating current or voltage in the first set of one or more capacitor pads, thereby heating the first Josephson junction, localizing, by the first RF emitter, the first electromagnetic signal toward the first set of one or more capacitor pads of the first Josephson junction to prevent annealing of a second Josephson junction on the superconducting qubit chip by the first electromagnetic signal; and
    annealing, by the first RF emitter, the first Josephson junction based on the emitting.

2. The computer-implemented method of claim 1, further comprising:
    controlling at least one of a duration, a frequency, or a magnitude of the first electromagnetic signal to generate a defined level of the annealing of the first Josephson junction.

3. The computer-implemented method of claim 2, further comprising:
    ceasing to emit the first electromagnetic signal based on achieving the defined level of the annealing of the first Josephson junction.

4. The computer-implemented method of claim 1, further comprising:
    annealing, by a second RF emitter, the second Josephson junction by emitting and localizing a second electromagnetic signal toward a second set of one or more capacitor pads of the second Josephson junction, wherein the emitting and localizing of the second electromagnetic signal occur independently of and concurrently or sequentially with the emitting and localizing of the first electromagnetic signal, thereby respectively facilitating independent and concurrent or sequential localized annealing of the first Josephson junction and the second Josephson junction.

5. The computer-implemented method of claim 4, wherein the first RF emitter is positioned above the first set of one or more capacitor pads of the first Josephson junction and the second RF emitter is positioned above the second set of one or more capacitor pads of the second Josephson junction.

6. The computer-implemented method of claim 1, wherein a frequency of the first electromagnetic signal belongs to the microwave region of the electromagnetic spectrum.

* * * * *